(12) United States Patent
Yamaguchi et al.

(10) Patent No.: US 6,930,388 B2
(45) Date of Patent: Aug. 16, 2005

(54) SEMICONDUCTOR DEVICE AND METHOD FOR MANUFACTURING THE SAME AND SEMICONDUCTOR DEVICE-MOUNTED STRUCTURE

(75) Inventors: Yoshihide Yamaguchi, Fujisawa (JP); Hiroyuki Tenmei, Yokohama (JP); Kosuke Inoue, Fujisawa (JP); Noriyuki Oroku, Yokohama (JP); Hiroshi Hozoji, Yokohama (JP); Shigeharu Tsunoda, Fujisawa (JP); Naoya Kanda, Fujisawa (JP); Madoka Minagawa, Ebina (JP); Ichiro Anjo, Koganei (JP); Asao Nishimura, Kokubuji (JP); Kenji Ujiie, Higashimurayama (JP); Akira Yajima, Ebina (JP)

(73) Assignee: Renesas Technology Corp., Tokyo (JP)

( * ) Notice: Subject to any disclaimer, the term of this patent is extended or adjusted under 35 U.S.C. 154(b) by 118 days.

(21) Appl. No.: 09/811,401

(22) Filed: Mar. 20, 2001

(65) Prior Publication Data

US 2002/0063332 A1 May 30, 2002

(30) Foreign Application Priority Data

Sep. 19, 2000 (JP) ........................................ 2000-284374

(51) Int. Cl.⁷ ........................ H01L 23/48; H01L 23/52; H01L 29/40
(52) U.S. Cl. ........................ 257/737; 257/738; 257/787
(58) Field of Search ........................ 257/737, 738, 257/787, 788, 791, 792, 793, 794, 795, 777, 778, 780

(56) References Cited

U.S. PATENT DOCUMENTS

| | | | | | |
|---|---|---|---|---|---|
| 5,550,407 A | * | 8/1996 | Ogashiwa | ................... | 257/737 |
| 5,834,844 A | * | 11/1998 | Akagawa et al. | ........... | 257/734 |
| 5,886,415 A | * | 3/1999 | Akagawa et al. | ........... | 257/789 |
| 6,111,311 A | * | 8/2000 | Suzuki | ....................... | 257/691 |
| 6,111,317 A | * | 8/2000 | Okada et al. | ................. | 257/737 |
| 6,153,448 A | * | 11/2000 | Takahashi et al. | .......... | 438/114 |
| 6,181,010 B1 | * | 1/2001 | Nozawa | ...................... | 257/737 |
| 6,181,569 B1 | * | 1/2001 | Chakravorty | ............... | 361/761 |
| 6,184,577 B1 | * | 2/2001 | Takemura et al. | .......... | 257/701 |
| 6,255,737 B1 | * | 7/2001 | Hashimoto | .................. | 257/784 |
| 6,313,532 B1 | * | 11/2001 | Shimoishizaka et al. | .... | 257/734 |
| 6,674,158 B2 | * | 1/2004 | Blalock | ...................... | 257/678 |

* cited by examiner

*Primary Examiner*—Asok Kumar Sarkar
(74) *Attorney, Agent, or Firm*—Antonelli, Terry, Stout & Kraus, LLP

(57) ABSTRACT

A semiconductor device is provided which enables a flip chip connection without use of underfill. The semiconductor device includes a semiconductor element having circuit electrodes and a circuit surface coated with a protecting film. A stress relaxation layer is provided by coating a cured thermoplastic resin onto the protecting film of the circuit surface in a manner which leaves the circuit electrodes exposed and curing it and having an inclination in the edge portion thereof. A wiring layer with wirings is connected to each of the circuit electrodes and disposed so as to make an electrical connection from the circuit electrodes, via the edge portion of the stress relaxation layer, and to a desired portion on the surface of the stress relaxation layer. A protecting film is provided thereon, and an external connection terminal is also provided.

24 Claims, 19 Drawing Sheets

(MATERIAL A)

(MATERIAL B)

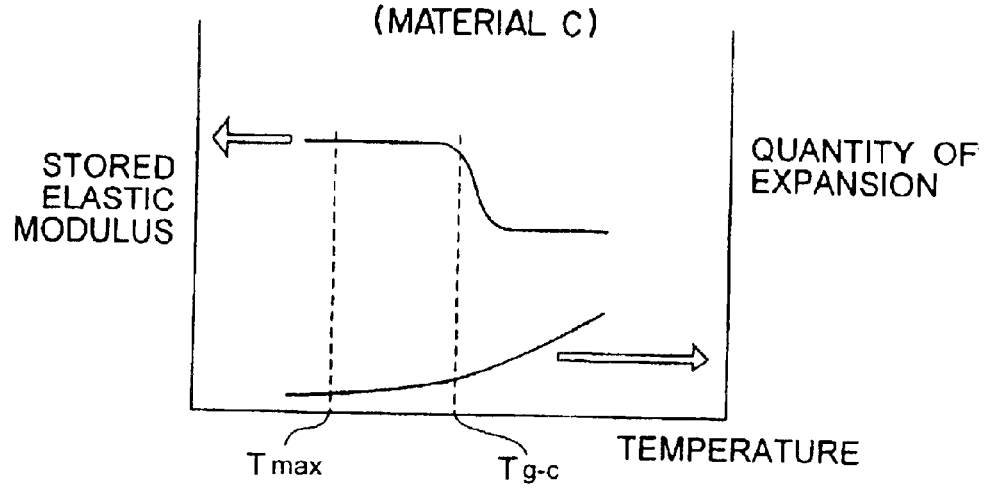
FIG. 23A (MATERIAL C)
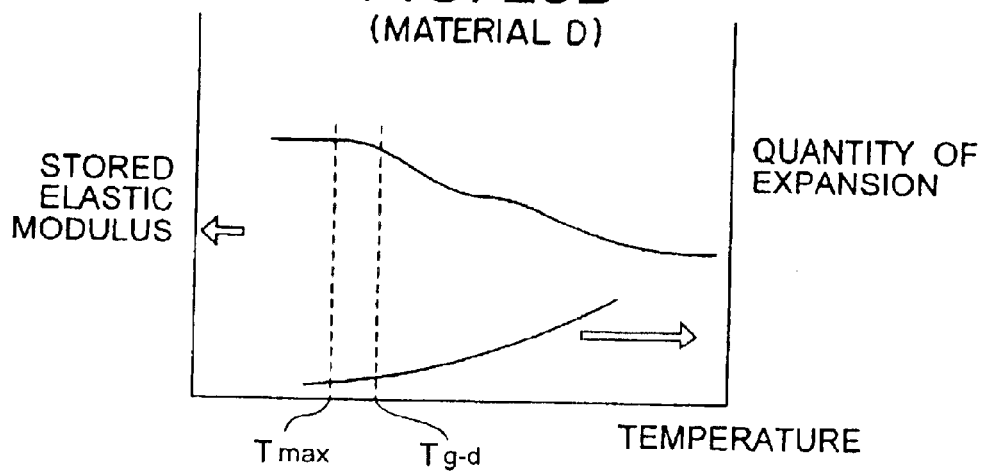
FIG. 23B (MATERIAL D)
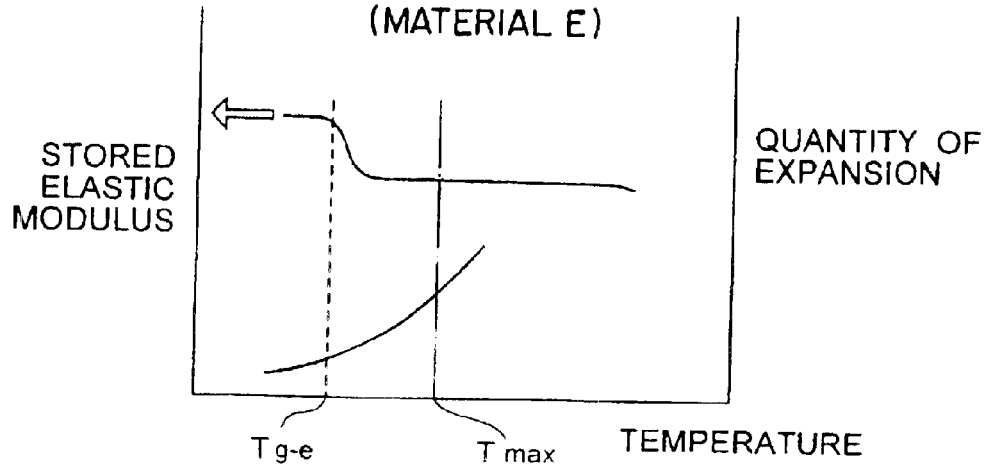
FIG. 23C (MATERIAL E)

CHARACTERISTIC PROPERTIES AND SPUTTER
RESISTANCE OF MATERIALS WHICH MAY
BE USED AS STRESS RELAXATION LAYER ( × :CRACKS FORMED
△ :WRINKLES FORMED
○ :NO ABNORMALITY )

MECHANISM OF WRINKLING AND CRACKING CAUSED BY SPUTTERING

SEMICONDUCTOR DEVICE AND METHOD FOR MANUFACTURING THE SAME AND SEMICONDUCTOR DEVICE-MOUNTED STRUCTURE

BACKGROUND OF THE INVENTION

The present invention relates to a semiconductor device enabling flip chip bonding, a method for manufacturing the same, and a semiconductor device-mounted structure.

As prior art concerning semiconductors enabling flip chip bonding, the semiconductor devices using an underfill are known as mentioned in JP-A-11-111768 (Prior Art 1). However, underfill is practiced for the purpose of preventing the break of connection part due to the strain caused by the heat generated in connection parts at the time of using a complete electric articles, and there is a problem that, when it is not practiced, the lifetime of connection of semiconductor devices becomes extremely short.

Prior arts enabling a flip chip connection without using underfill are disclosed in JP-A-11-54649 (Prior Art 2) and JP-A-11-354560 (Prior Art 3). The prior Art 2 discloses a semiconductor device comprising a semiconductor substrate on which semiconductor elements are disposed, element electrodes disposed on the main plane of said semiconductor substrate and electrically connected to said semiconductor elements, an elastic material layer formed on the main plane of said semiconductor substrate and made of an insulating elastic material, an opening part formed by removing at least a part of the elastic material layer so as to expose the element electrodes on the semiconductor substrate, a metallic wiring layer which continuously extends from upper part of the element electrode to the upper part of said elastic material layer, an external electrode provided on said elastic material layer as a part of said metallic wiring layer to realize an electrical connection to exterior instruments, and a surface protecting film covering said metallic wiring layer. It is also mentioned therein that said semiconductor substrate is in the state of a chip diced out from a wafer. Further, it is also mentioned therein that said elastic material layer (low elastic modulus layer) preferably has a thickness of 10–150 μm, and elastic modulus thereof (Young's modulus) is more preferably in the range of 10–1,000 kg/mm², and coefficient of thermal expansion thereof is more preferably in the range of 10–100 ppm/° C. Further, it is also mentioned therein that the material constituting said elastic material layer may be a photosensitive insulating polymer film such as an ester-bonding type polyimide, acrylate type epoxy or the like, so long as the polymer film has a low elastic modulus and is insulating. Further, it is also mentioned that, when a non-photosensitive insulating film is used, the element electrodes on the semiconductor substrate can be exposed by a mechanical processing using laser or plasma or a chemical processing such as etching.

The descriptions in the Prior Art 3 are also similar to the above.

However, none of Prior Art 2 and Prior Art 3 gives a sufficient consideration to the prevention of break of wiring layer formed on the surface of elastic material layer (stress relaxation layer).

SUMMARY OF THE INVENTION

It is an object of the present invention is to solve the above-mentioned problem by providing a semiconductor device prevented from break of wiring layer, decreased in the frequency of occurrence of defectives and making it possible to realize a flip chip connection necessitating no underfill, a method for manufacturing the same, and a semiconductor device-mounted structure.

In order to achieve the object mentioned above, the present invention is so constructed as is mentioned in the claims.

That is, the present invention provides a semiconductor device comprising: a semiconductor element having a circuit surface on which a plurality of circuit electrodes are disposed, said circuit surface being coated with a protecting film, a stress relaxation layer which is formed on the protecting film of the circuit surface of said semiconductor element so as to expose the circuit electrodes, is made of a cured thermoplastic resin and has an inclination in the edge portion thereof, a wiring layer consisting of a plurality of wirings, each of said wirings being connected to one of the circuit electrodes and disposed so as to make an electrical connection from said circuit electrode, via the edge portion of stress relaxation layer and to a desired site on the surface of the stress relaxation layer, a surface protecting film which covers the surface of the wiring layer so as to expose a prescribed portion on each of the plurality of wirings on the surface of the stress relaxation layer, and an external connection terminal formed by connecting a bump to said prescribed exposed portion of each of the plurality of wirings.

The present invention further relates to said semiconductor device in which a swelling portion is formed in the surrounding part connected to the inclined edge portion of the stress relaxation layer and a deflected portion is formed in the wiring existing on the swelling portion. Break of wirings can be prevented thereby.

The present invention further relates to said semiconductor device in which the melting temperature Tm of the cured thermoplastic resin in the stress relaxation layer is not lower than the maximum attainable temperature Tmax in the process of forming the wiring layer and the surface protecting layer.

The present invention further relates to said semiconductor device in which the melting temperature Tm of the cured thermoplastic resin in the stress relaxation layer is not lower than 350° C.

The present invention further relates to said semiconductor device in which glass transition temperature Tg of the cured thermoplastic resin in the stress relaxation layer is in the range of from 150° C. to 400° C.

The present invention further relates to said semiconductor device in which coefficient of thermal expansion of the cured thermoplastic resin in the stress relaxation layer is not greater than 200 ppm/° C.

The present invention further relates to said semiconductor device in which thickness of the stress relaxation layer is in the range of from about 35 μm to about 150 μm.

The present invention further relates to said semiconductor device in which the cured thermoplastic resin in the stress relaxation layer is at least one member selected from the group consisting of polyimide, polyamide, polyamide-imide, epoxy, phenolic and silicone.

The present invention further relates to said semiconductor device in which the protecting film formed on the semiconductor element is constituted of an inorganic film and an organic film locally formed on said inorganic film.

The present invention further relates to said semiconductor device in which the wirings are formed so that the width of the wiring in the edge portion of the stress relaxation layer is greater than the width of wiring in the flat portion of the stress relaxation layer, at least regarding signal wirings.

The present invention further relates to said semiconductor device in which the wiring layer is constructed of an electric power supply film layer contact-bonded to the surface of said stress-relaxation layer and a plating film layer.

The present invention further relates to a semiconductor device comprising a semiconductor element having a plurality of circuit electrodes disposed thereon and a circuit surface coated with a protecting film, a stress relaxation layer formed on the protecting film of the circuit surface of said semiconductor element so as to expose the circuit electrodes, which is made of a cured resin having a glass transition temperature Tg falling in the range of from 150° C. to 400° C. and has an inclination in the edge portion thereof, a wiring layer consisting of a plurality of wirings connected to each of the circuit electrodes and electrically connected from said circuit electrode via the edge part of the stress relaxation layer to a desired site on the surface of the stress relaxation layer, a surface-protecting film covering the surface of said wiring layer so as to expose a prescribed portion of the plurality of wirings on said stress relaxation layer, and an exterior connection terminal formed by connecting a bump to the prescribed exposed portion of each of the plurality of exposed wirings.

The present invention further relates to a mounted structure of semiconductor device constituted by mounting said semiconductor device on said circuit substrate by connecting the exterior connection terminal of said semiconductor device to electrodes formed on a circuit substrate.

The present invention further relates to a method for manufacturing a semiconductor device comprising:

a wafer-producing step for producing a wafer having a plurality of semiconductor elements disposed thereon having a circuit surface having a plurality of circuit electrodes disposed thereon, a protecting film-forming step for forming a protecting film on the circuit surface of each semiconductor element, which is in the state of a wafer produced in said wafer-producing step, a stress relaxation layer-forming step which comprises forming a stress relaxation layer by printing a thermoplastic resin paste on the protecting film of wafer state formed in said protecting film-forming step by the mask printing method so as to expose said circuit electrodes, followed by curing the printed stress relaxation layer, a wiring layer-forming step a wiring layer consisting of a plurality of wirings, each of said wirings being connected to one of the circuit electrodes in the abovementioned wafer state and disposed so as to make an electrical connection from the circuit electrode, via the edge portion of the stress relaxation layer formed in the stress relaxation layer-forming step, to a desired site on the surface of the stress relaxation layer, a surface protecting film-forming layer for exposing each prescribed site portion of the plurality of wirings on said stress relaxation layer and coating the exposed surface of the wiring layers in the wafer state formed in the wiring layer-forming step with a protecting film, an external connection terminal-forming step for connecting a bump to each prescribed site of the plurality of wirings exposed in the wafer state, and a dicing step for dicing the wafer state of product into a desired unit to obtain a semiconductor device.

The present invention further relates to said method for manufacturing a semiconductor device, in which said wiring layer-forming step comprises a sputtered film-forming step and a plated film-forming step.

The present invention further relates to the stress relaxation layer-forming step in said method for manufacturing a semiconductor device, in which the thermoplastic resin paste contains insulating particles.

As has been mentioned above, according to the construction of the present invention, a thermoplastic resin material is used as a material of the stress relaxation layer, due to which the solvent comes to vaporize upon the heat-cure and thereby the shape of the swelling portion formed by the mask printing can be maintained (secured) and, as its result, the formation of deflected portion and thereby caused break of wiring can be prevented.

BRIEF DESCRIPTION OF THE DRAWINGS

FIG. 23 illustrates the characteristics properties in a case where thermosetting resins C, D and E are used as a material of a stress relaxation layer according to the present invention.

DETAILED DESCRIPTION OF THE EMBODIMENTS

An embodiment of the present invention will be described below with reference to the drawings. In all the drawings, like parts are referenced correspondingly. Hence, duplication of description will be often omitted and the scales of respective parts may be made different from those of actual parts for the purpose of facilitating the description.

Figure 1:
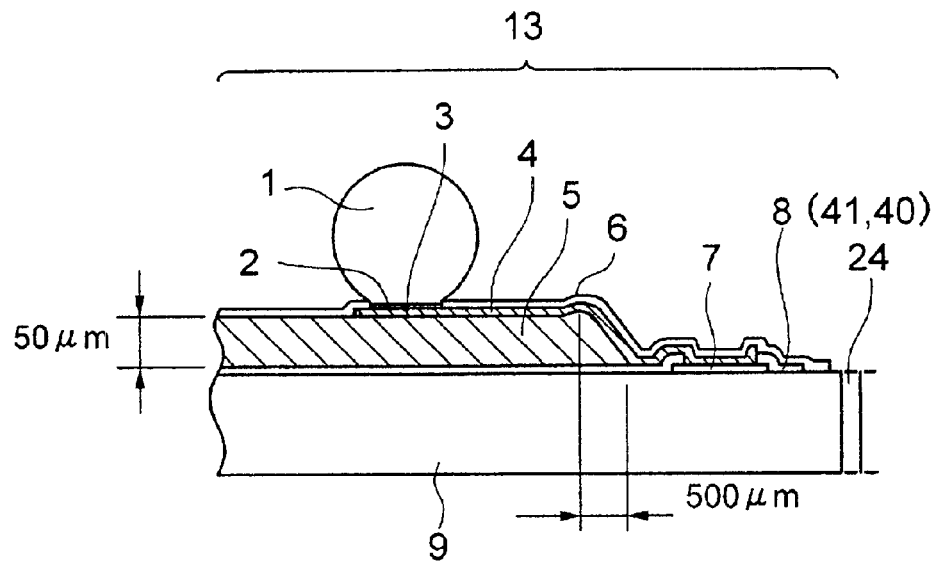
FIG. 1 is a partial sectional view illustrating the structure of one example of the semiconductor device according to the present invention.

The structure of a semiconductor device according to the present invention will be described at first. Although a large number of semiconductor devices are produced collectively on a wafer in practice, a part picked up from the wafer will be described for the purpose of facilitating the description. FIG. 1 shows a sectional view showing a part of the semiconductor device 13 according to this embodiment.

The wafer 9 having semiconductor circuits formed thereon means a wafer that is obtained after a Front End of the Line (FEOL) in a semiconductor producing process is performed and before the wafer is cut into a large number of semiconductor devices 13. Each semiconductor device 13 has an external connection terminal such as an aluminum pad (circuit electrode) 7. The aluminum pad 7 on which a gold wire or the like is connected is used for electrical connection to an external terminal of a semiconductor package such as a QFP (quad flat package) when the conventional semiconductor device 13 is encapsulated in a semiconductor package. While a dicing area 24 is used when the wafer 9 having the large number of semiconductors formed thereon is cut into chip-shape semiconductor devices 13, the surface of the semiconductor device (circuit surface) 13 having the semiconductor circuit formed therein is covered with a protective film 8 except portions on the aluminum pad (circuit electrode) 7, the dicing area 24 and around the latter. The protective film 8 is made of a material having a thickness in a range of from 1 to 10 micrometers. Specifically, an electrically insulating resin of an inorganic material, or, a combination of an electrically insulating resin from an inorganic material and an electrically insulating resin of an organic material may be used as the protective film 8. That is, the protective film 8 may be made of an electrically insulating film of an inorganic material or may be made of a composite film consisting of an inorganic electrically insulating film of an inorganic material and an organic electrically insulating film of an organic material laminated on the inorganic one. In the composite film, a photosensitive resin material is preferably used as the organic film. Examples of the photosensitive material preferably used as the organic film in the protective film 8 in this embodiment include photosensitive polyimides, photosensitive benzocyclobutenes, photosensitive polybenzoxazoles, etc. In this embodiment, the material of the protective film is not limited to the aforementioned materials, but any suitable one of known available inorganic or organic materials or a composite film thereof may be used as the protective film. For example, SiN, $SiO_2$, or the like, can be used as the inorganic film.

Figure 17A:
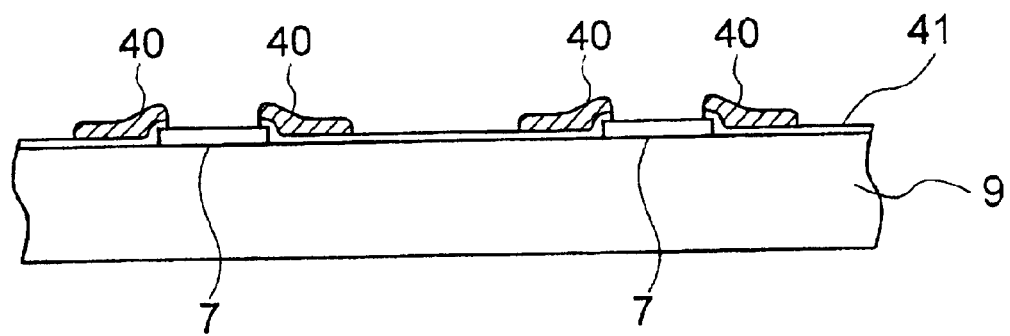
FIG. 17 is a sectional view and a plan view illustrating the first embodiment in which an organic film as a protecting film on a wafer is locally formed.
Figure 17B:
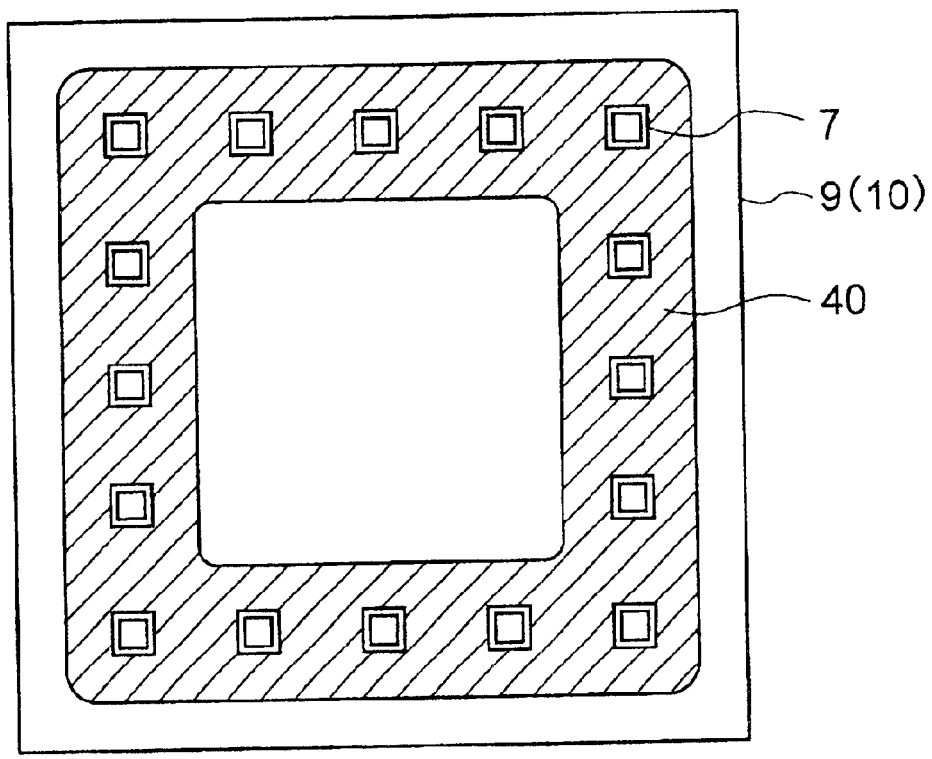
Figure 18A:
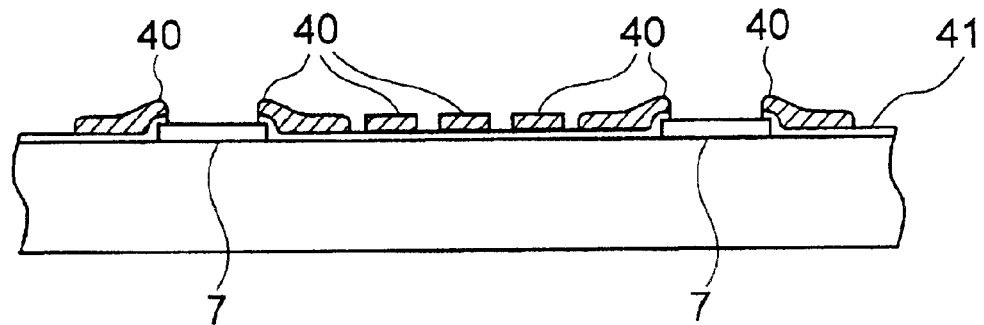
FIG. 18 is a sectional view and a plan view illustrating the second embodiment in which an organic film as a protecting film on a wafer is locally formed.
Figure 18B:
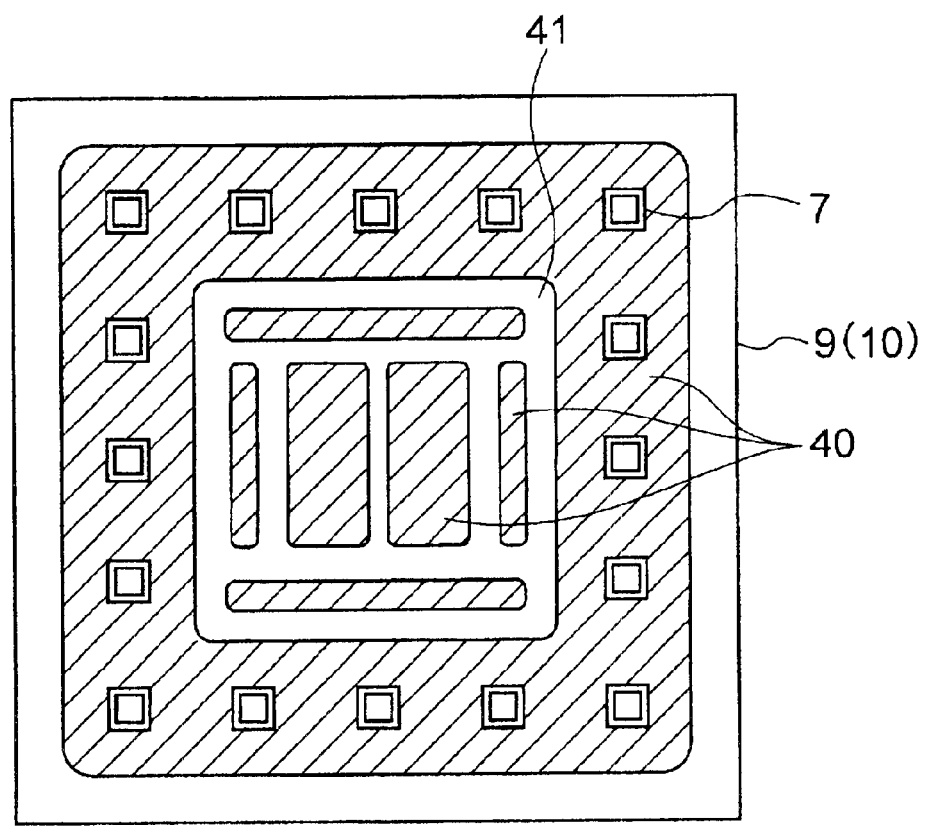
Figure 19:
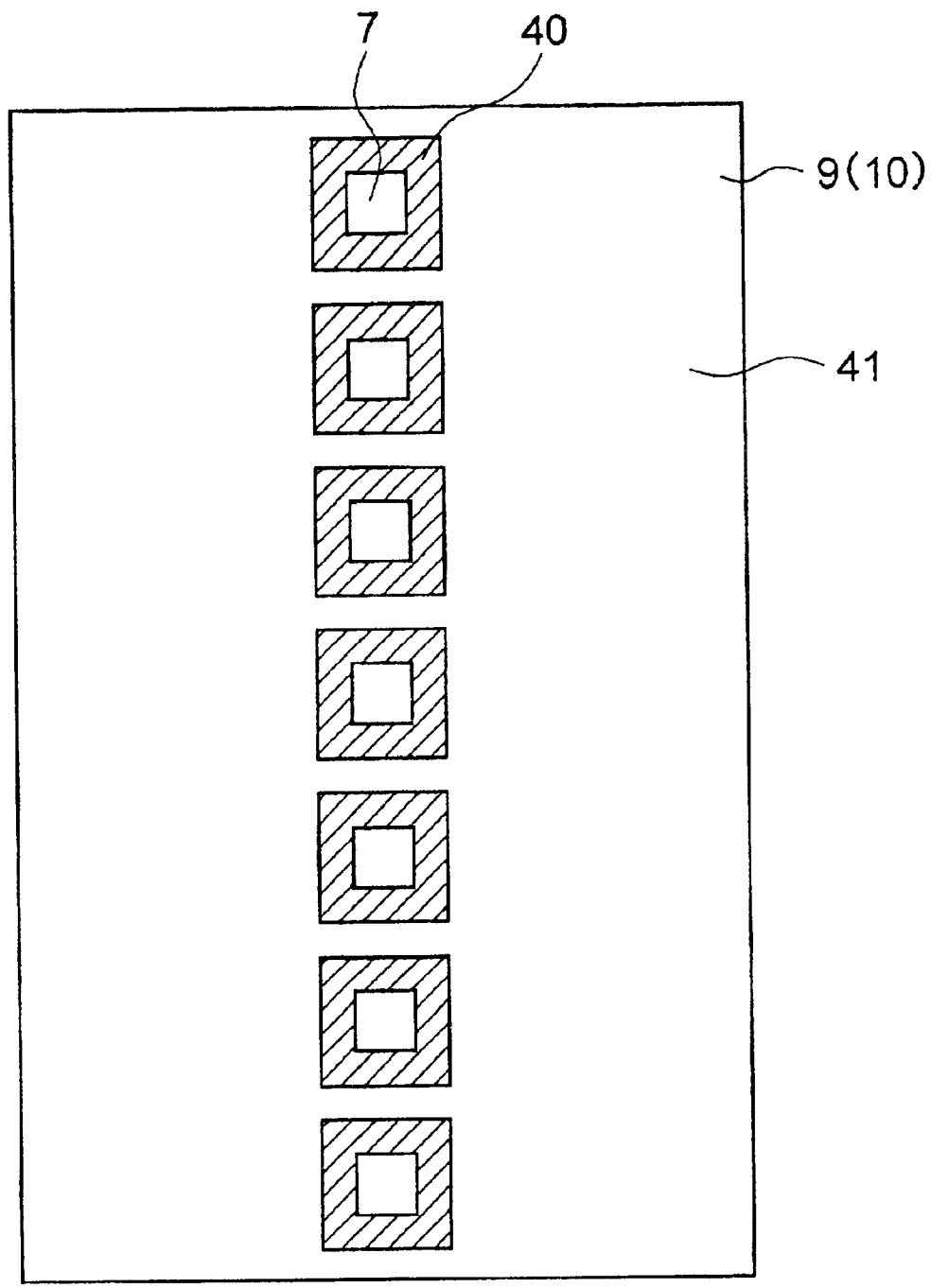
FIG. 19 is a sectional view and a plan view illustrating the third embodiment in which an organic film as a protecting film on a wafer is locally formed.
Figure 20:
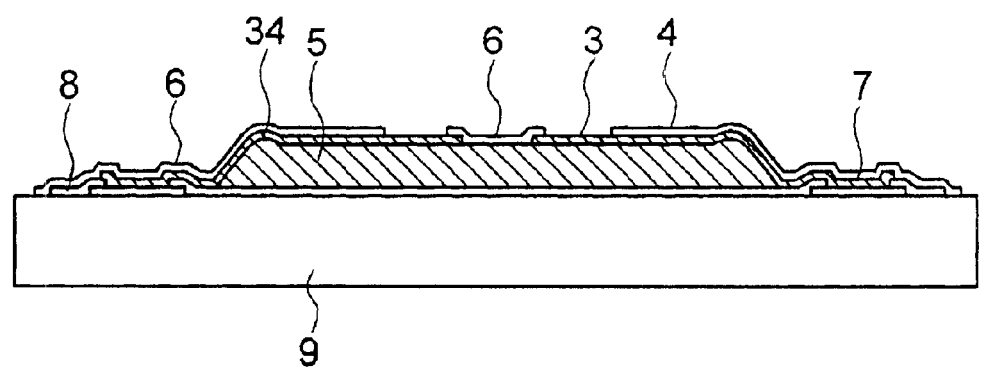
FIG. 20 is a sectional view illustrating one embodiment of semiconductor device which has passed Step 1 to Step 7 of the present invention.

Of course, the organic film may cover almost the whole surface of the inorganic film. Alternately, the organic film may be formed only on a region around the vicinity of the aluminum pad (circuit electrode) 7 as shown in FIG. 17. Alternately, the organic film may be selectively formed in a plurality of optional places on the surface of the inorganic film as shown in FIG. 18. By limiting the organic film formation region as described above, the warpage of the wafer 9 induced by the internal stress in the protective film 8 can be reduced. This is advantageous in terms of handling in the production process, focussing at exposure, etc. The "region near the aluminum pad 7" in this embodiment means a region within the maximum distance of 1 mm from each edge of the aluminum pad 7. Although FIGS. 17 and 18 show the cases where the organic film around the aluminum pad 7 is continuously formed, it is a matter of course that organic films are independently formed around individual aluminum pads respectively. Specifically, organic films may be formed in regions as shown in FIG. 19. What should be selected among the shapes shown in FIGS. 17 to 19 is to be determined in consideration of the patterning precision of the photosensitive resin used for the organic film, the internal stress in the film and the device characteristic of the semiconductor device. To take the device characteristic as an example, the device characteristic means that the level of a potential barrier in each active cell (transistor) inside the device varies in accordance with the stress applied on the semiconductor device.

A stress relaxation layer 5 having a thickness in a range of from 35 to 150 micrometers is formed selectively on the protective film 8. The thickness of the stress relaxation layer cannot be decided precisely because it also depends on the size of the semiconductor device, the elastic modulus of the stress relaxation layer, the thickness of the semiconductor device, etc. According to a stress simulation experiment conducted upon a bimetal model constituted by a combination of a semiconductor device and a stress relaxation layer formed on a surface of the semiconductor device under the condition that the thickness of the semiconductor device generally used is in a range of from about 150 to about 750 micrometers, it has been found that the required thickness of the stress relation layer is preferably in a range of from 10 to 200 micrometers, more preferably in a range of from 35 to 150 micrometers. Accordingly, the thickness of the stress relaxation layer in this embodiment is selected to be in the more preferable range. The selected thickness of the stress relaxation layer corresponds to about 1/20 to about 1/5 as large as the thickness of the semiconductor device. If the thickness is smaller than 35 micrometers, desirable stress relaxation cannot be obtained. If the thickness is larger than 150 micrometers, a warp of the wafer is caused by the internal stress of the stress relaxation layer 5 per se. As a result, focussing failure in an exposure process, handling failure in a wiring process, or the like, is apt to occur. Hence, there is a problem that productivity is lowered. The stress relaxation layer 5 is made of a resin material having an elastic coefficient greatly smaller than that of the semiconductor wafer 9, for example, an elastic modulus in a range of from 0.1 GPa to 10 GPa at room temperature, particularly a thermoplastic resin material. When the elastic modulus of the stress relaxation layer is in this range, a reliable semiconductor device can be obtained. That is, if the elastic modulus of the stress relaxation layer is smaller than 0.1 GPa, the stress relaxation layer can hardly support the weight of the semiconductor device so that there may be apt to arise a problem that the characteristic of the semiconductor device becomes unstable. On the other hand, if the elastic modulus of the stress relaxation layer is larger than 10 GPa, a warp of the wafer is induced by the internal stress of the stress relaxation layer 5. As a result, focussing failure in an exposure process, handling failure in a wiring process, or the like, is apt to occur. Accordingly, there is even a risk that a disadvantage such as cracking of the wafer happens. An edge portion of the stress relaxation layer 5 is inclined at an average gradient of from 5 to 30%. If the inclination angle is lower than 5%, the inclined edge portion is too long to obtain a desired thickness. When, for example, the inclination angle is 3% in terms of average gradient, a horizontal distance of the left or right edge portion larger than 3 millimeters is respectively required for obtaining a thickness of 100 micrometers. Hence, if the total horizontal distance of the left and right edge portions is larger than about 7 millimeters, a desired thickness can be obtained. On the other hand, if the inclination angle is higher than 30%, there is no problem in the horizontal distance but there is a high risk that a step coverage cannot be obtained in the wiring process. Particularly there is sufficiently little process margin in a process of coating of a plating resist, exposure and development, so that remarkable skill and technique is required. If the inclination angle is further larger, stress is concentrated into the edge portion because of a so-called stress concentration effect. As a result, the redistributing wire 4 tends to be broken in the edge portion, so that the wiring structure may need to be formed with a special arrangement.

In FIG. 1, a film appears 50 micrometers thick at a horizontal distance of 500 micrometers from one edge of the stress relaxation layer 5. Hence, the average gradient is 10%.

Further, the surface of the stress-relaxation layer 5 of this embodiment has to be connected to an aluminum pad 7 through a redistributing wire 4 made of a conductive material such as copper or the like in order to form a bump pad 3. That is, the redistributing wire 4 is made of an electrical conductor such as copper. The redistributing wire 4 connects the aluminum pad (circuit electrode) 7 to an electrode, for example a bump pad 3, for forming a terminal for an external connection such as a solder ball on a surface of the stress relaxation layer 5. A gold plating 2 for preventing the bump pad 3 from being oxidized may be provided on the bump pad 3. While a dicing area 24 is provided for dicing the wafer 9 having the plurality of semiconductors into individual semiconductor devices 13, the surface of the semiconductor device 13 is covered with a surface protective film 6 except a portion on the bump pad 3 and on the dicing area 24.

The protective film 8 and the stress relaxation layer 5 are entirely covered and sealed with the surface protective film 6. Hence, the protective layer 8 and the stress relaxation layer 5 can be prevented from being peeled from the surface of the wafer 9 having the semiconductor devices formed thereon. Moreover, invasion of substances such as ions causing deterioration in performance of semiconductors can be reduced. Because the protective film 8, the stress relaxation layer 5 and the surface protective film 6 are all set back from the dicing area 24, they are not damaged when the wafer is diced and separated into the semiconductor devices.

Any kind of resin material having electrically insulating characteristic can be used as the surface protective film 6. Because it is necessary to be patterned, a photosensitive material is preferably used but a material suitable for high precision printing such as ink jet printing may be used to form the film 6 by printing. Alternately, the film 6 may be formed by the steps of: forming an electrically insulating film on a whole surface by an inexpensive coating method such as curtain coating; forming an etching resist as a resist pattern by a photolithography process; etching the electrically insulating film through the resist pattern; and removing the resist.

In this embodiment, various kinds of material may be used as the aforementioned materials. Examples of the material include: (1) acryl-modified photo-sensitive epoxy resins or photosensitive polyimide resins preferably used as photosensitive materials; (2) polyamideimide resins and polyimide resins preferably used as ink jet printing materials; and (3) modified triazole resins, modified melamine resins and polyimide resins preferably used as flat film-forming materials. More specifically, solder resist preferably used in a printed wiring board producing process as an inexpensive photosensitive resin material in a printed board producing process, photosensitive polyimide used in a surface cover of a flexible printed board, or the like, is preferably used as the photosensitive material for the surface protective film 6. On the other hand, Photoneece (trademark) made by Toray Industries, Inc., or the like, is preferably used as the flat film-forming material. Incidentally, the material used in this embodiment is solder resist.

A bump 1 for mounting semiconductor device 13 on circuit substrate is formed on the bump pad 3. The bump 1 is generally made of a solder material. The bump 1 serves as an external connection terminal here.

Figure 2:
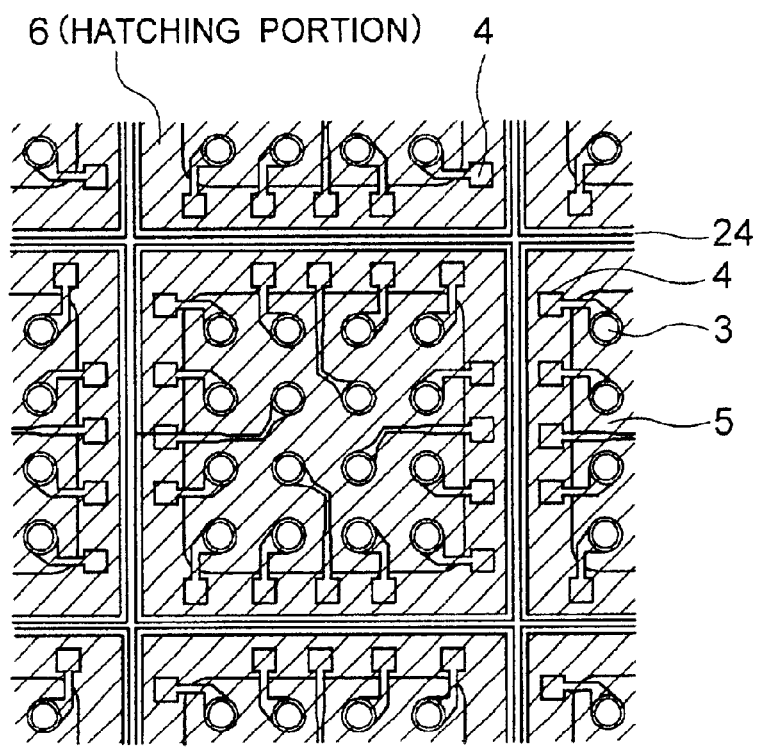
FIG. 2 is a plan view illustrating a state that a semiconductor device according to the present invention is formed continuously.

FIG. 2 is a plan view showing a state in which neighboring semiconductor devices 13 shown in FIG. 1 are formed adjacently on a wafer. Although bumps actually exist, they are omitted in FIG. 2. The hatched portion in FIG. 2 represents solder resist used as the surface protective film 6. Each stress relaxation layer 5 is shaped in a rectangular form having rounded corners. Each dicing area 24 is disposed between adjacent semiconductor devices 13 to thereby serve as a dicing tab for separating the semiconductor devices 13 individually. The dicing tab is preferably located in a range of, for example, from 10 to 100 micrometers from one edge of the surface protective film 6. If the dicing tab is located shorter than 10 micrometers from the edge, there is a tendency that chipping of the semiconductor device is induced during a device separation. If the dicing tab is located longer than 100 micrometers from the edge, the available area for each semiconductor device is reduced. Accordingly, in this embodiment, it is preferable to set the gap from the dicing tab to the edge of the surface protective film 6 to be in a range of from 10 to 100 micrometers in order to improve the yield of the semiconductor devices 13. Incidentally, an aluminum pad 7 not shown is actually disposed under an end portion of the redistributing wire 4.

Figure 21:
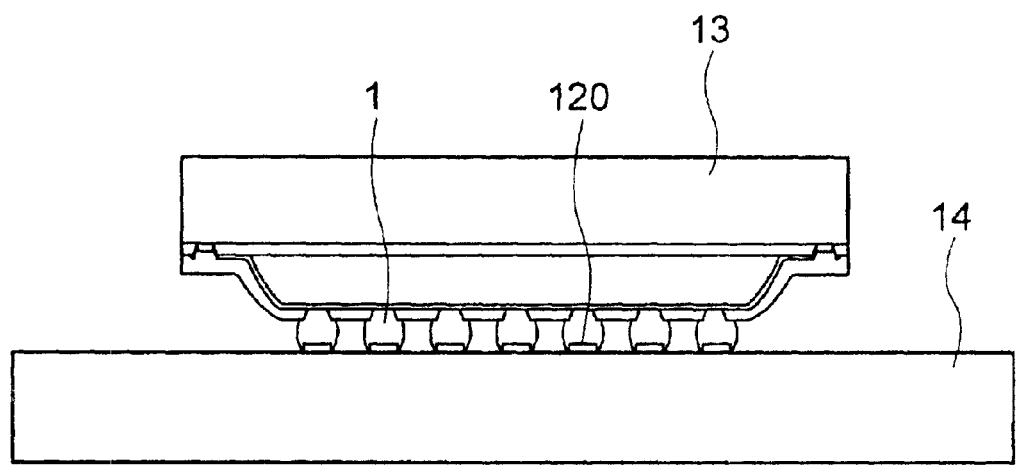
FIG. 21 illustrate one embodiment in which the semiconductor device of the present invention is mounted on a substrate.

According to the above-mentioned semiconductor device structure, the stress relaxation layer 5 exists between the redistributing wire 4 and the wafer 9. Accordingly, strain of the bump 1 induced by the evolved heat can be spread when each semiconductor device 13 bonded onto the circuit substrate 14 operates. Hence, the lifetime of bonding of the semiconductor device 13 can be elongated even in the case where the semiconductor device 13 is mounted on the circuit substrate 14 without application of underfill 15 as shown in FIG. 21. Moreover, because the stress relaxation layer 5 has a gentle inclined portion, there is no bent along the redistributing wire 4 which a stress should concentrated at.

Figure 3:
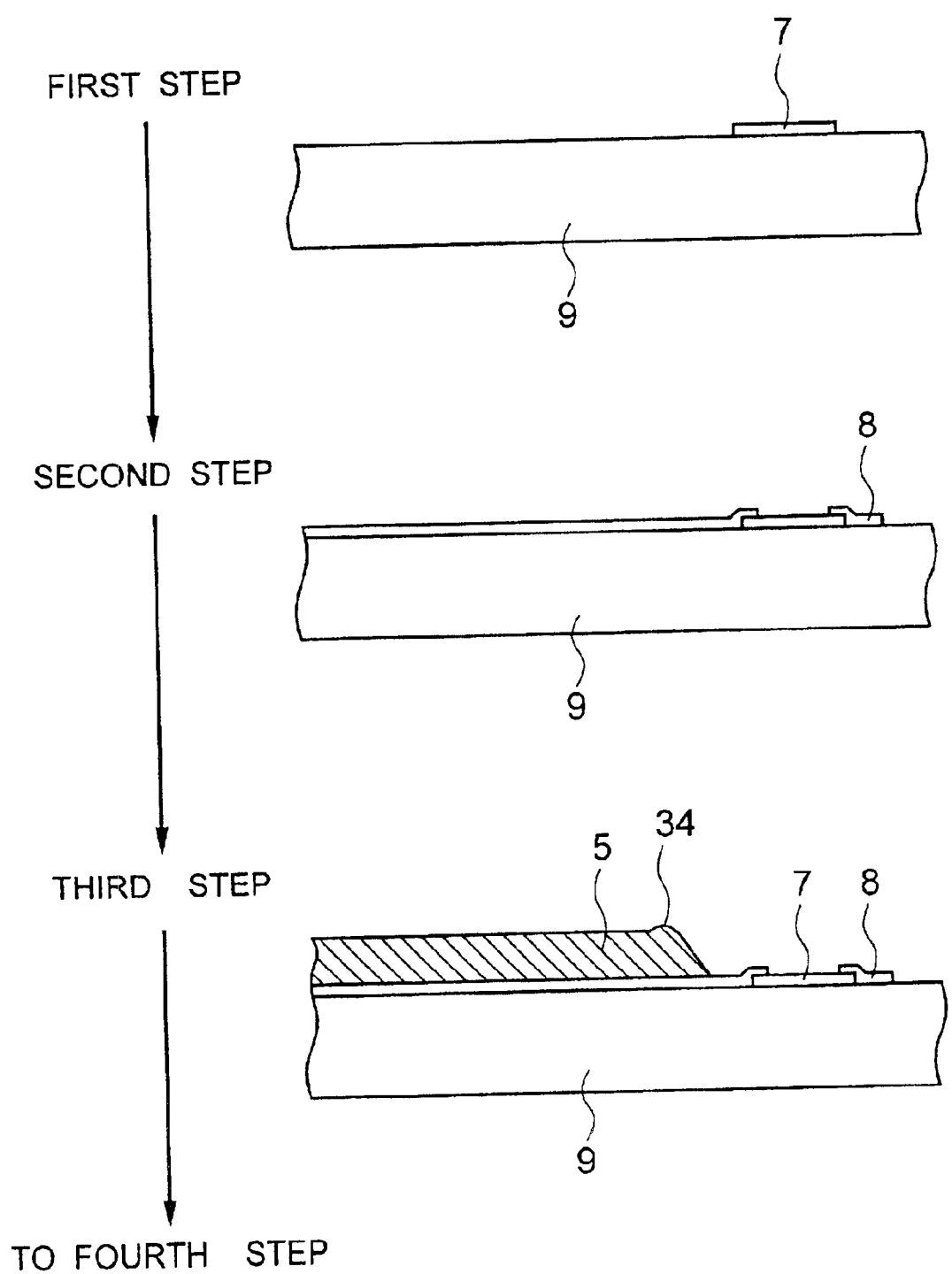
FIG. 3 illustrates Step 1 to Step 3 constituting one example of the method for manufacturing a semiconductor device according to the present invention.
Figure 4:
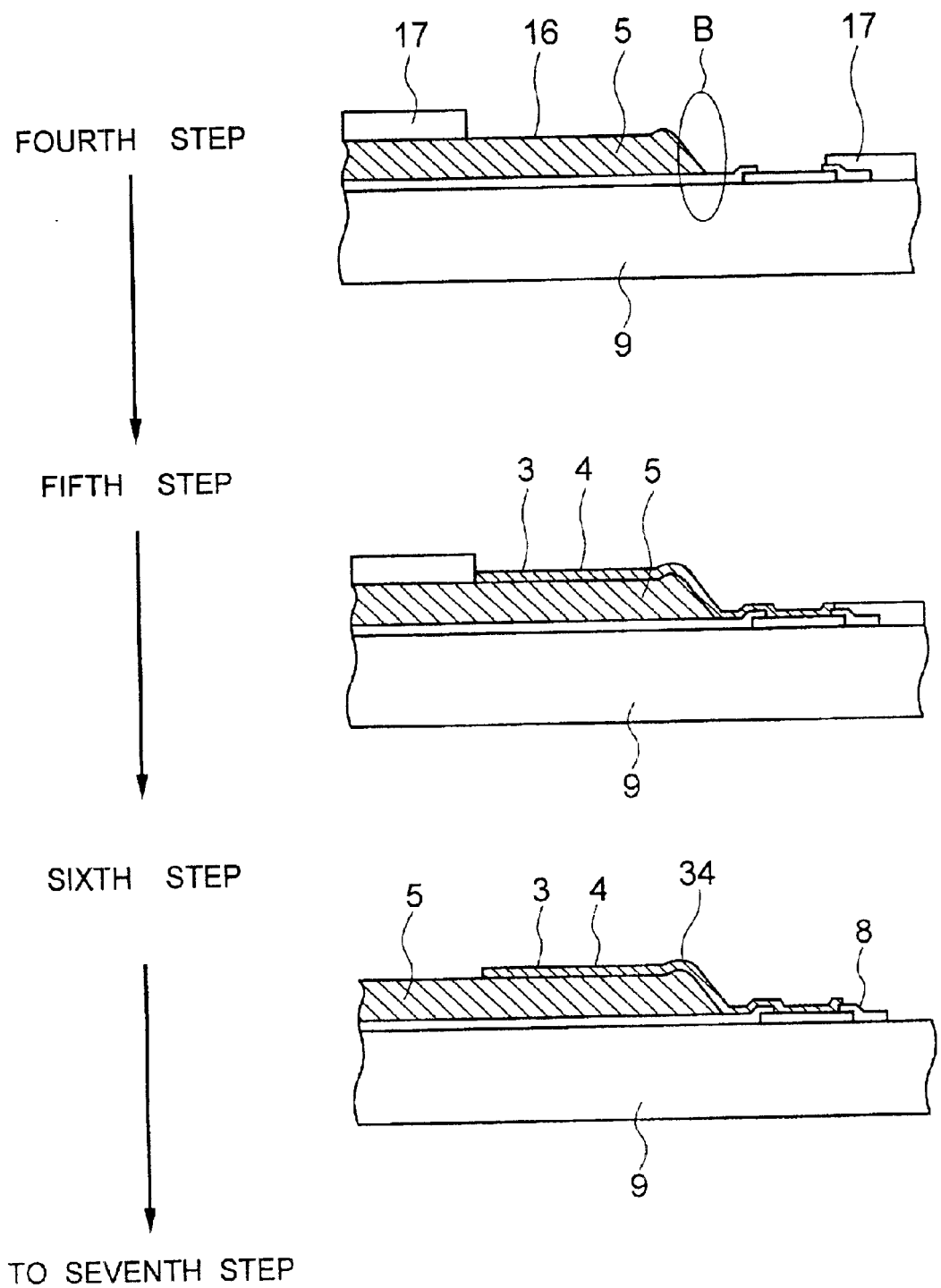
FIG. 4 illustrates Step 4 to Step 6 constituting one example of the method for manufacturing a semiconductor device according to the present invention.
Figure 5:
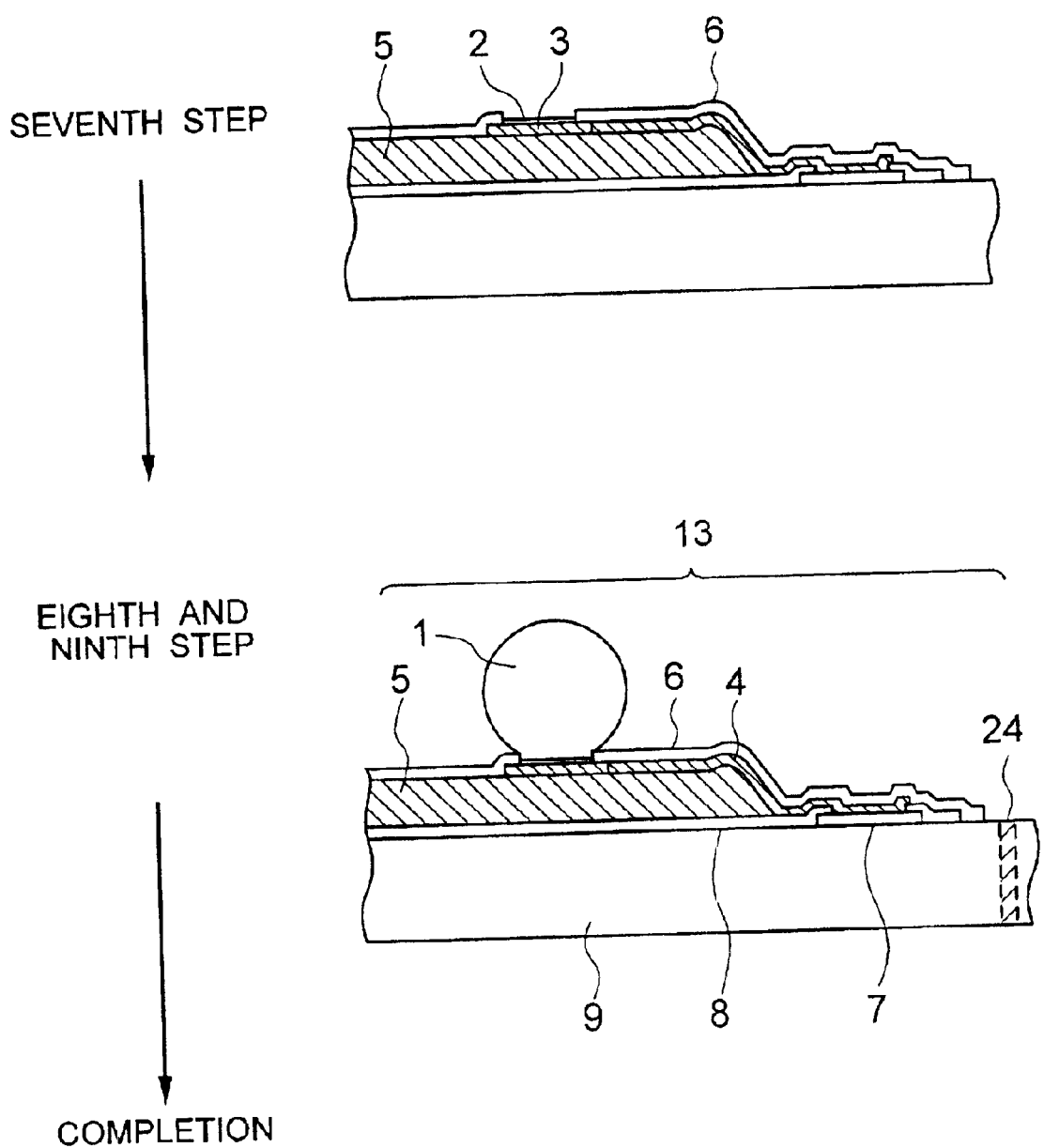
FIG. 5 illustrates Step 7 to Step 9 constituting one example of the method for manufacturing a semiconductor device according to the present invention.

An example for the fabrication process of the semiconductor device 13 in this embodiment will be described below with reference to the drawings. FIG. 3 shows first, second and third steps. FIG. 4 shows fourth, fifth and sixth steps. FIG. 5 shows seventh, eighth and ninth steps. Incidentally, each of the drawings is a sectional view showing only a part to facilitate the understanding of the sectional structure of the semiconductor device 13 in this embodiment.

First Step

The wafer 9 having semiconductors with aluminum pads 7 for external connection is produced by the same steps as the conventional semiconductor device 13. Although the material of the external connection pad in the semiconductor device used in this embodiment is aluminum, the external connection pad may be made of copper. This is because the external connection is not wire-bonded in this embodiment so that it is not a matter of concern about the bonding trouble on a copper made external bonding pad. If the external connection pad is made of copper, the electric resistance of the wiring can be reduced. Hence, copper is preferable for the external connection pad also from the viewpoint of improvement in electrical characteristic of the semiconductor device.

Second Step

A protective film 8 is formed as occasion demands. The protective film 8 may be formed of an inorganic material in advance in a so-called FEOL in a semiconductor producing process. Alternately, the protective film 8 may be formed in a composite layer of an inorganic material and an organic material formed on the inorganic material. In this embodiment, a protective film 8 about 6 micrometers thick is formed as follows. An electrically insulating film is made of an inorganic material in a so-called FEOL in a semiconductor producing process. For example, the electrically insulating film is made of silicon nitride prepared by a CVD method, or the like; silicon dioxide prepared from tetraethoxysilane, or the like; or a composite film thereof. Photosensitive polyimide as an organic material is applied onto the inorganic electrically insulating material, exposed, developed and cured to thereby form a protective film 8 about 6 micrometers thick. Hence, the protective film 8 is formed on the wafer 9 having semiconductors formed thereon. Although this embodiment shows a case where the thickness of the protective film 8 is 6 micrometers, the required thickness varies in accordance with the kind of the semiconductor device and is set to be in a range of from about 1 to about 10 micrometers. Incidentally, it is a matter of course that the organic film may be formed so as to cover approximately the whole surface of the inorganic film as shown in FIG. 2. Alternately, the organic film may be formed only in a region near the aluminum pad 7 as shown in FIGS. 17 to 19. When the electrically insulating film is made of an inorganic material alone, the thickness of the film is selected to be not larger than 3 micrometers. Besides photosensitive polyimide, in this embodiment, polybenzoxazole, polybenzocyclobutene, polyquinoline, polyphosphasen, etc. may be used. FIG. 17(b), FIG. 18(b) and FIG. 19 illustrate the chip region 10.

Third Step

A paste-like polyimide material is printed on a portion where a stress relaxation layer 5 will be formed. Then, the printed polyimide material is heated and cured. Thus, the stress relaxation layer 5 according to this embodiment having a film thickness of about 10 to about 200 $\mu$m (preferably about 35 to about 150 $\mu$m) is formed on the protective film 8.

Fourth Step

An electric power supply film 16 (made of, for instance, Cr thin film and Cu thin film) to be used for electroplating is formed by a method such as sputtering. Then, a reverse pattern 17 for wiring is formed by use of a photoresist.

Fifth Step

An electroplating is performed by use of the electric power supply film 16 and the reverse pattern 17 for wiring. Thus, a redistributing wire 4 and a bump pad 3 are formed. As occasion demands, the electroplating may be repeated so as to form the redistributing wire 4 into a multilayer structure.

Sixth Step

The reverse pattern 17 for wiring of the photoresist and the electroplating power supply film 16 are removed by etching.

Seventh Step

A surface protective film 6 is formed of a solder resist. An electroless gold plating 2 is applied onto the outermost surface of the bump pad 3 by use of this pattern.

Eighth Step

A solder ball is placed together with flux on the bump pad 3 and heated so as to be bonded to the bump pad 3. Thus, a bump 1 is formed.

Ninth Step

The wafer 9 having semiconductors formed thereon is cut into pieces at the dicing sites 24 by a wafer dicing technique, whereby semiconductor devices 13 which can be connected and mounted on circuit substrate 14 can be completed as shown in FIG. 21.

The procedure from the third step to the eighth step will be described below in detail.

Figure 6:
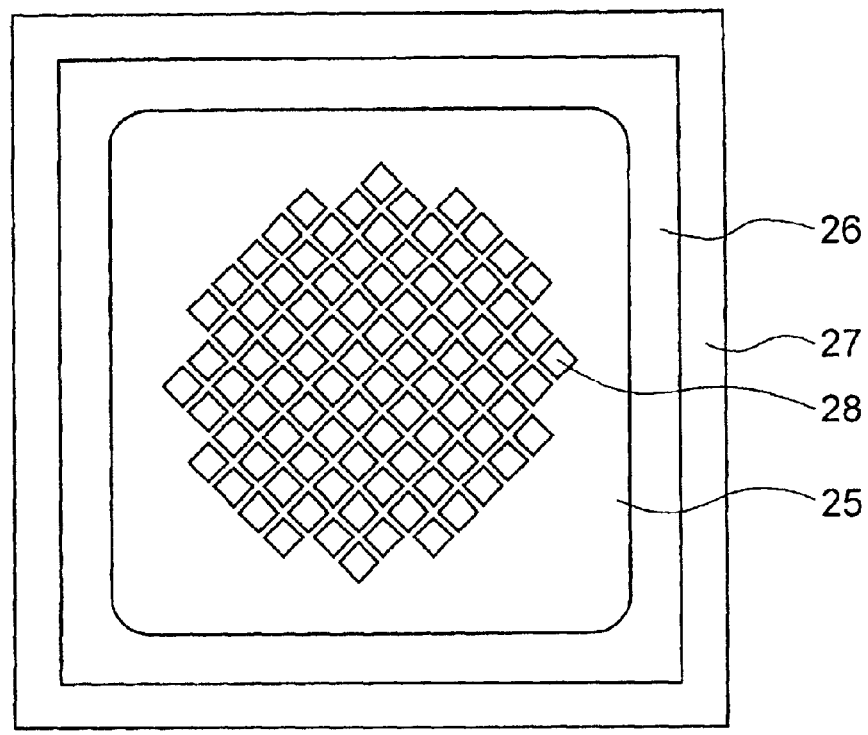
FIG. 6 illustrates a printing mask used for formation of a stress relaxation layer according to the present invention.
Figure 7:
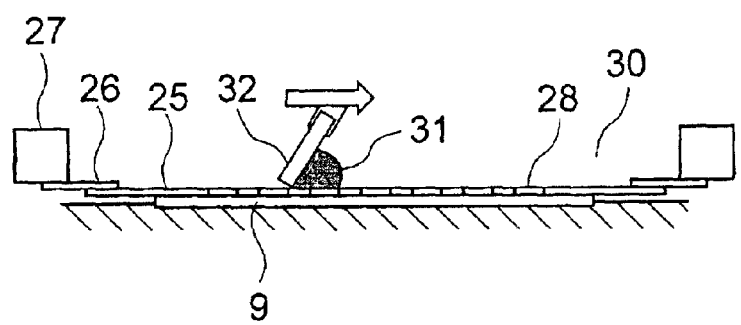
FIG. 7 illustrates a step of printing a stress relaxation layer.
Figure 8:
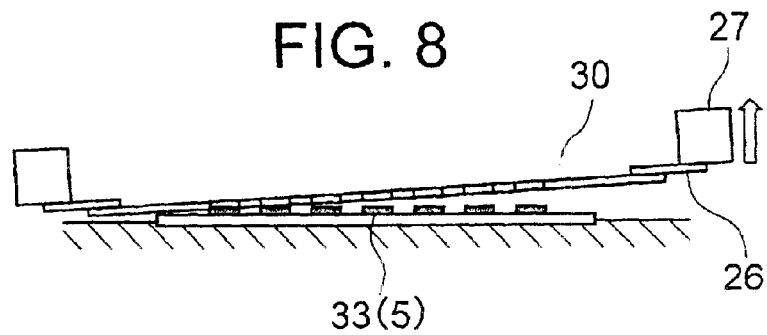
FIG. 8 illustrates a plate-releasing step in which the printing mask ascends to separate from the printing mask.

The third step will be described first. Since the stress relaxation layer 5 according to this embodiment must have a film thickness of about 10 to about 200 $\mu$m (preferably from about 35 to about 150 $\mu$m), it is formed by a printing method. A mask used for printing may have the same structure as that of the print mask for printing a solder paste etc. on a printed wiring board. For example, as shown in FIG. 6, a metal mask of a combination in which a stencil 25 of a nickel alloy is stuck to a frame 27 through the intermediary of a resin sheet 26 can be used. Because the paste is spread out by about 50 micrometers after printing, a pattern opening portion 28 of the print mask may be formed to be small correspondingly to the area of the spread paste. A paste printing is performed as shown in FIG. 7. That is, the print mask and the pattern of the wafer 9 having semiconductors formed thereon are brought into contact with each other in an aligned state aligned. In this state, a squeegee moves on the stencil 25 to thereby fill the pattern opening portion 28 with the paste. Then, the print mask is lifted up relative to the wafer 9 having semiconductors formed thereon. So-called contact printing is performed in the aforementioned manner. Incidentally, the contact between the wafer and the print mask does not always mean that there is no screen gap between the two. Actually, it is practically difficult to stick the print mask onto the wafer without any screen gap because the protective film 8 has been already partially formed on the wafer. In this embodiment, printing is performed under a print condition such that the screen gap between the wafer and the print mask is selected to be in a range of from 0 to 100 micrometers. Alternately, another printing method may be used as follows. The whole squeegee surface of the print mask is coated with the paste by the first squeegeeing. Then, the pattern opening portion 28 of the print mask is filled with the paste by the second squeegeeing and an excess of the paste is removed. Then, the print mask is lifted up relative to the wafer 9 having semiconductors formed thereon. The print mask may be lifted up vertically to the wafer 9 or, as shown in FIG. 8, the print mask may be lifted up with an inclination angle relative to the wafer 9. Under prerequisite of such an inclined release angle, it is easy to accomplish the uniformity of the angle for the print mask from the wafer. Moreover, because the print mask is released from one end of the wafer toward the other end of the wafer, the final release which is often unstable is carried out on an area where no semiconductor device is formed. Hence, this is advantageous also in terms of improvement in the yield. Further, when printing is performed continuously on a plurality of wafers by use of one printing machine, the step of wiping the rear side of the mask plate at suitable period may be preferably inserted. For example, in this embodiment, the rear side of the mask plate is cleaned every 10 continuous wafers. That is, printing is performed on the eleventh wafer after cleaning. The period, the number of times and the method for cleaning the rear side of the mask need be adjusted suitably in accordance with the viscosity of the paste material, the concentration of non-volatile in the paste material, the amount of filler in the paste material, etc.

Then, the wafer 9 on which semiconductors are formed and the paste is printed is heated step by step on a hot plate or on a heating furnace to thereby cure the paste. Thus, the formation of the stress relaxation layer 5 is completed.

The material used for forming the stress relaxation layer 5 is polyimide paste, which can be cured during a heat after printed on the protective film 8. The polyimide paste contains a polyimide precursor, a solvent, and a large number of polyimide fine particles dispersed in the solvent. Specifically, the fine particles used here are fine particles having a particle size distribution exhibiting a mean particle size in a range of from 1 to 2 micrometers and a maximum particle size of about 10 micrometers. When cured, the polyimide precursor used in this embodiment forms the same material as that of the polyimide fine particles. Hence, when the polyimide paste is cured, a homogeneous stress relaxation layer 5 of one kind of material is formed. Although this embodiment has shown the case where polyimide is used as the material for the stress relaxation layer, this embodiment may be applied also to the case where any resin other than polyimide such as an amide-imide resin, an ester-imide resin, an ether-imide resin, a silicone resin, an acrylic resin, a polyester resin, modified resins of the above resins, etc. may be used. When any resin other than polyimide is used, it is preferable that the surfaces of the polyimide fine particles are treated to have compatibility with the resin other than polyimide or the resin composition is modified to improve affinity with the polyimide fine particles.

Among the above-listed resins, resins having imide bonds, such as polyimide, amide-imide, ester-imide, ether-imide, etc., are excellent in heat mechanical characteristic such as strength at a high temperature because the resins have strong skeletons formed by imide bonds. As a result, the method of forming a plating power supply film for wiring can be selected from various methods. For example, a method of forming a plating power supply film by a high-temperature process such as sputtering can be selected. Resins, such as a silicone resin, an acrylic resin, a polyester resin, an amide-imide resin, an ester-imide resin and an ether-imide resin, having portions condensed by bonds other than imide bonds are slightly inferior in heat mechanical characteristic but may be advantageous in terms of processability, resin cost, etc. For example, a polyester-imide resin is easy to handle because the curing temperature of polyester-imide is generally lower than that of polyimide. In this embodiment, these resins are used suitably and selectively in overall consideration of device characteristic, cost, heat mechanical characteristic, etc.

The viscoelasticity of the material can be adjusted by dispersion of polyimide fine particles in polyimide paste. Thus, a paste excellent in printability can be used. The thixotropy of the paste can be controlled by adjustment of the mixture proportion of the fine particles. Hence, printability can be improved by adjustment of the blend proportion in combination with adjustment of viscosity. Moreover, the inclination angle on the edge of the stress relaxation layer 5 can be adjusted. The thixotropy of the paste used in this embodiment is preferably in a range of from 2.0 to 3.0 in terms of so-called thixotropy index obtained on the basis of the ratio of the viscosity measured at a rotational speed of 1 rpm to the viscosity measured at a rotational speed of 10 rpm by using a rotaviscometer. Incidentally, in the case of a paste exhibiting temperature dependence on the thixotropy index, a good result can be obtained when printing is made in such a temperature range that the thixotropy index is selected to be in a range of from 2.0 to 3.0.

Figure 9:
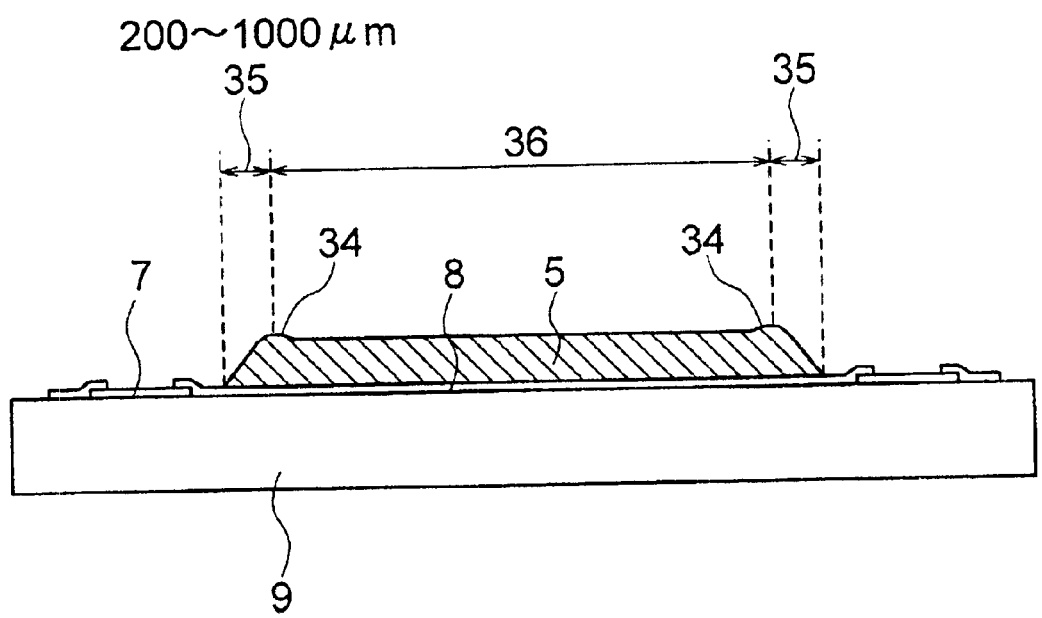
FIG. 9 is a sectional view illustrating a semiconductor device on which a stress relaxation layer has been formed.

After the printed polyimide paste is heated and cured, a stress relaxation layer 5 having a sectional shape as shown in FIG. 9 is formed on the wafer 9. When the stress relaxation layer 5 is formed by printing in the aforementioned manner, a protrusive portion may appear in a position distanced by 200 to 1000 micrometers from an edge lump of the stress relaxation layer 5. The position and presence/absence of the protrusive portion can be controlled to a certain degree by adjustment of the blend of the polyimide paste and alteration of various conditions concerning printing. Incidentally, in this case, the words "various conditions concerning printing" include metal mask thickness, squeegeeing velocity, squeegee material, squeegeeing angle, squeegee pressure, squeegee release velocity, wafer temperature during printing, moisture during printing environment, etc.

Although the height and shape of the protrusive portion can be controlled under the above-mentioned printing conditions, adjustment of the shape of the protective film 8 may serve other control methods. For example, if the organic layer-forming region of the protective film 8 is limited to a region near the pad 7 as shown in FIG. 17A, it is easy to protrude the stress relaxation layer at a portion corresponding to the upper portion of the organic layer.

Further, a protrusive portion which is formed intentionally in the stress relaxation layer 5 as shown in FIG. 1 affords a flexible portion along the wiring 4. Thus, the aforementioned structure can effectively absorb the stress induced by thermal expansion, etc. so that the wiring 4 can be prevented more greatly from being disconnected. Specifically, it is preferable that a protrusive portion is formed to be higher by about 25 micrometers at maximum, more preferably by 7 to 12 micrometers than the average height of the stress relaxation layer 5. Vertices of the protrusive portion of the aforementioned height can be formed sufficiently by mask printing. Assuming that the protrusive portion is a semicylinder shape with a radius of 10 micrometers, the length of the semicircle of the protrusive portion would be (2×3.14× 10 micrometers)/2=31.4 micrometers. Hence, the redundant length of the wiring is 31.4−10=21.4 micrometers per one protrusive portion. When one swelling portion is formed on each of opposite sides of the stress relaxation layer, the sum redundant length of the wiring is 42.8 micrometers. Because a redundant portion can be provided in the wiring 4 in the aforementioned manner, thermal stress affecting on the wiring structure and the solder junction portion is relaxed. Hence, a highly reliable wiring structure can be obtained. Incidentally, the required thickness of the protrusive portion is determined on the basis of experiment and simulation in consideration of the thickness and elastic modulus of the stress relaxation layer 5, the size of the semiconductor device 13, the electric power consumed by the semiconductor device, the physical properties of the circuit substrate 14 for mounting the semiconductor device thereon, etc. For example, in this embodiment, the maximum quantity of thermal deformation of the wiring portion on the circuit substrate in an actual environment is 15(ppm/° C.)×L/2 (mm)×200(° C.)=0.0015 L millimeters when L (mm) is the diagonal length of the semiconductor device 13, the difference between the coefficient of thermal expansion of the semiconductor device 13 and that of the circuit substrate 14 for mounting the semiconductor device 13 thereon is 15 ppm/° C., and the maximum temperature range due to ON/OFF during a process of mounting the semiconductor device 13 on the substrate is 200° C. Hence, it is conceived to be sufficient if the required redundant length of the protrusive portion is about 0.002×L millimeters. In this embodiment, the protrusive portion is looked upon as a semicylindrical shape on the basis of the aforementioned calculation, hence the protrusive portion is higher in a range of from about L/2000 to about L/500 millimeters than the average height of the stress relaxation layer 5.

Now, in a case where the printed pasty resin is a thermoplastic resin specifically as mentioned later specifically, it has been confirmed experimentally that the heat-cure vaporizes solvent, which makes it possible to control the shape of protrusive portion 34 formed by the mask printing and, as its result, it is possible to form a deflected portion on the wiring 4 formed thereon and thereby to prevent the break of wiring 4.

Contrariwise, when the heat-cure of the printed pasty resin is accompanied by melting of the resin, as is often the case with a thermosetting resin, the protrusive portion formed by the mask printing often disappears as described later and, as its result, it is difficult to effectively form a deflected portion on the wiring 4 formed thereon.

If the required thickness of the stress relaxation layer 5 cannot be formed by printing and heat-curing by one time, the required thickness can be obtained by repeating printing and material-curing by a plurality of times. For example, a paste having a concentration of non-volatile of from 30 to 40% through a metal mask having a thickness of 65 micrometers yields the stress relaxation layer 5 with the thickness of about 50 micrometers after twice repetition of printing and curing. Particularly with respect to the bump 1 disposed in the position where strain is apt to be concentrated when the semiconductor device 13 is bonded onto the circuit substrate 14, concentration of strain can be relaxed by an increase of the thickness of the stress relaxation layer 5 in a portion corresponding to the position where the bump 1 is disposed. Therefore, for example, metal masks different from that which was used in the first-time printing can be used for printing polyimide paste on the wafer 9 having semiconductors formed thereon.

Alternately, as a second method, adjustment of the shape of the protective layer 8, just under the bump where strain is apt to be concentrated, may afford a partial change of the thickness of the stress relaxation layer. For example, when a protective film is formed so that an inorganic film 41 composed of only an inorganic film is used in a region just under the corresponding bump 1 and a composite layer composed of an inorganic film and an organic film is used in the other region, the thickness of the low elastic stress relaxation layer 5 can be thickened by the portion of the thickness of the organic film in the region just under the bump. When the stress relaxation layer is formed on the aforementioned protective film, a gentle inclined portion of the stress relaxation layer is formed on an edge A between where the organic protective film is contained in the protective film and where the organic protective film is not contained.

Assuming that the stress relaxation layer has a thickness of 50 micrometers and an elastic modulus of 1 GPa and the organic film in the protective film has a thickness of 10 micrometers and an elastic modulus of 3 GPa, the average elastic coefficient (GPa/$\mu$m) of a portion where the organic protective film and the stress relaxation layer are located becomes (3×10+1×50)/60≈1.3. On the other hand, the average elastic coefficient of the inclined portion in the portion A is 1. In such a structure, thermal stress on the stress relaxation layer is spread from the peripheral portion into the portion where the organic protective film is formed. Hence, the bump disposed in the peripheral portion where thermal stress is apt to be otherwise concentrated can be prevented from being broken.

Incidentally, the stress relaxation layer need not always contain fine particles. If visco-elasticity can be kept at minimum required for the printing, fine particles are not necessary to be dispersed in the paste. When fine particles are not dispersed in the paste, there is, however, a possibility that the margin for various conditions concerning printing may be narrowed extremely.

The fourth step will be described next. In this embodiment, the redistributing wire 4 is provided as two layers consisting of a copper electroplating layer and a nickel electroplating layer. Incidentally, one end of the redistributing wire 4 may serve also as a bump pad 3. Although this embodiment has shown the case where both copper and nickel are electroplated so as to form an electrical conductor, electroless plating is also applicable to the present invention.

First, an electric power supply film 16 for performing electroplating is formed on the whole surface of the semiconductor wafer. Although evaporation, electroless copper plating, CVD, or the like, may be used here, sputtering excellent in adhesion to the protective layer 8 and to the stress relaxation layer 5 is used in this embodiment. As a pre-process of sputtering, a sputter etching is performed for keeping current conduction between the bonding pad 7 and the electrical conductor of the redistributing wire 4. In this embodiment, a multilayer film of chromium (about 75 nm to about 0.1 $\mu$m)/copper (about 0.2 $\mu$m to about 0.5 $\mu$m) is formed as a sputtered film. The function of chromium here is to keep adhesion between copper and the stress relaxation layer, or the like, located above and under the chromium. The film thickness of chromium is preferably selected to be as small as possible but sufficient to keep the adhesion. If the film thickness of chromium is large, a great deal of time is required to form the film. Hence, a problem would appear on a lowered productivity. In addition, the protective layer 8 and the stress relaxation layer 5 are exposed to high-energy-state plasma produced in a sputtering chamber for a long time. Hence, there would arise a risk that materials of the protective layer 8 and the stress relaxation layer 5 may be spoiled. Incidentally, although the required film thickness of chromium varies also in accordance with the sputter etching and sputtering conditions, the film quality of chromium, etc, the thickness is generally 0.5 micrometers at maximum. Incidentally, the chromium film used in this embodiment may be replaced by a titanium film, a titanium/platinum film, tungsten, or the like. On the other hand, it is preferable that thickness of the sputtering copper is selected to be minimum so that no film thickness distribution of a plating film is generated, when the copper electroplating and the nickel electroplating are performed in a post-process. That is, the film thickness is determined also in consideration of the quantity of reduction of the film owing to acid washing, etc., performed as a pre-process of plating so that it does not induce the film thickness distribution. If the film thickness of sputtering copper is made larger than required, for example, larger than 1 micrometers, the sputtering time is elongated so as to cause a problem that productivity is lowered. In addition, it is inevitable that it takes a long time to remove the power supply film 16 by etching which will be performed as a post-process. As a result, a side etching of the redistributing wire 4 is made large. In a simple calculation, an etching of a power supply film 1 micrometer thick is accomplished with side etch at each side of the wire is also etched by 1 micrometer, that is, the opposite sides of the wire are etched by 2 micrometers in total. In the actual production, an overetching is generally performed to avoid imperfect etching of the power supply film. Hence, when a power supply film 1 micrometer thick is etched, the wire is actually side-etched by about 5 micrometers. If the side etching is made so large, a problem is apt to happen in the viewpoint of wiring performance because wiring resistance is apt to increase or because wire breakage is apt to be induced. Therefore, the film thickness of sputtering copper is selected to be 1 micrometer at maximum approximately.

Then, a reverse pattern shape 17 to the redistributing wire 4 is formed by using a resist with a photolithography technique. The resist in the edge portion of the stress relaxation layer 5 as represented by the area B in FIG. 4 is thicker in comparison with that in the other portion because of the resist coming down from the inclined portion in comparison with that in the other portion. Hence, a negative type resist is preferably used for keeping resolution high. If a liquid resist is used as the resist, the resist is apt to be thinner on the upper portion of the inclined surface on the edge of the stress relaxation layer 5 as represented by the area B in FIG. 4 and, on the other hand, the resist is apt to be thicker on the lower portion of the inclined surface. Hence, a wide developing margin with respect to the film thickness is required for patterning the resist different in film thickness between the upper portion and the lower portion on the inclined surface in the same quantity of exposure and under the same developing condition. Generally, a developing margin of a negative type photosensitive resist is wider with respect to thickness than that of a positive type photosensitive resist. Therefore, a negative type photosensitive liquid resist is used in this embodiment. Incidentally, when a film resist is to be used, either negative type resist or positive type resist can be used because there is no film heat difference produced between the upper and lower portions of the inclined surface. However, a negative type resist often afford a good result because the inclined portion is exposed so obliquely that the effective optical path length is elongated. When the inclination angle of the edge portion of the stress relaxation layer 5 is large or when a film resist having weak bleaching characteristic is used, a negative type resist is particularly preferably used.

Figure 10:
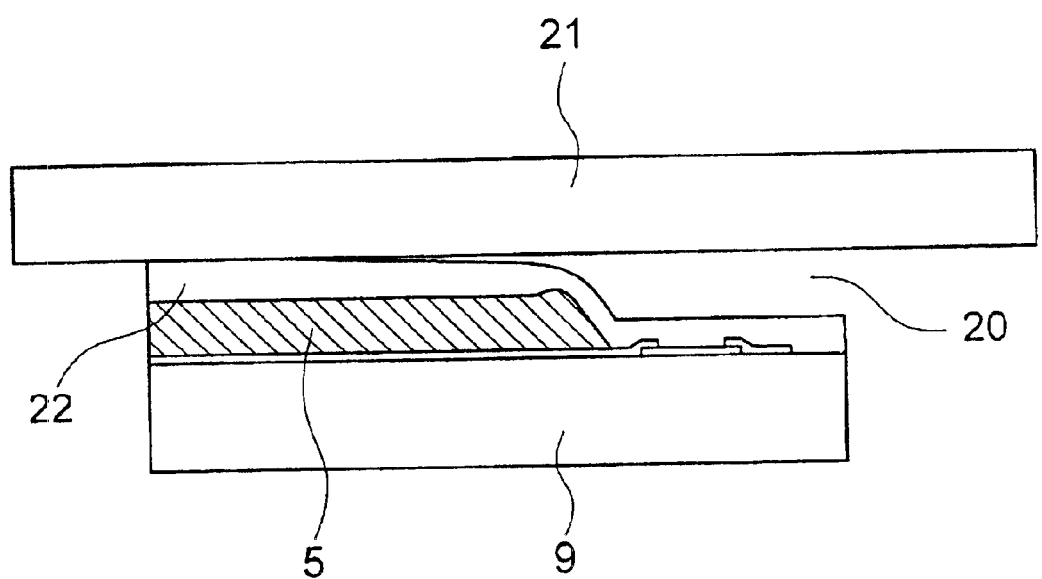
FIG. 10 illustrates a state that a photo-exposing mask is brought into a close contact with a resist.

In this embodiment, there is used an exposure machine of the type in which an exposure mask 21 and a resist 22 contact to each other but a screen gap 20 is partially formed as shown in FIG. 10. The resolution limit of the exposure machine was about 10 micrometers when the exposure mask 21 and the resist 22 contact to each other. According to the experimental result by the present inventors, the relationship between the screen gap 20 below the exposure mask 21 and the line width to be subject to resolution was as shown in Table 1. Incidentally, values in Table 1 vary in accordance with the optical system of the exposure machine, the developing condition, the sensitivity of the resist, the resist curing condition, the ratio of the line width to the line space, etc.

The experimental result in Table 1 shows values in the case where the ratio of the line width to the line space is 1.0.

TABLE 1

| Line Width | Screen Gap below Exposure Mask [μm] | | | |
|---|---|---|---|---|
| [μm] | 40 | 60 | 80 | 100 |
| 15 | X | X | X | X |
| 20 | ○ | X | X | X |
| 25 | ○ | ○ | ○ | X |
| 30 | ○ | ○ | ○ | ○ |
| 40 | ○ | ○ | ○ | ○ |
| 50 | ○ | ○ | ○ | ○ |

○: Resolution was possible.
X: Resolution was impossible.

Figure 11:
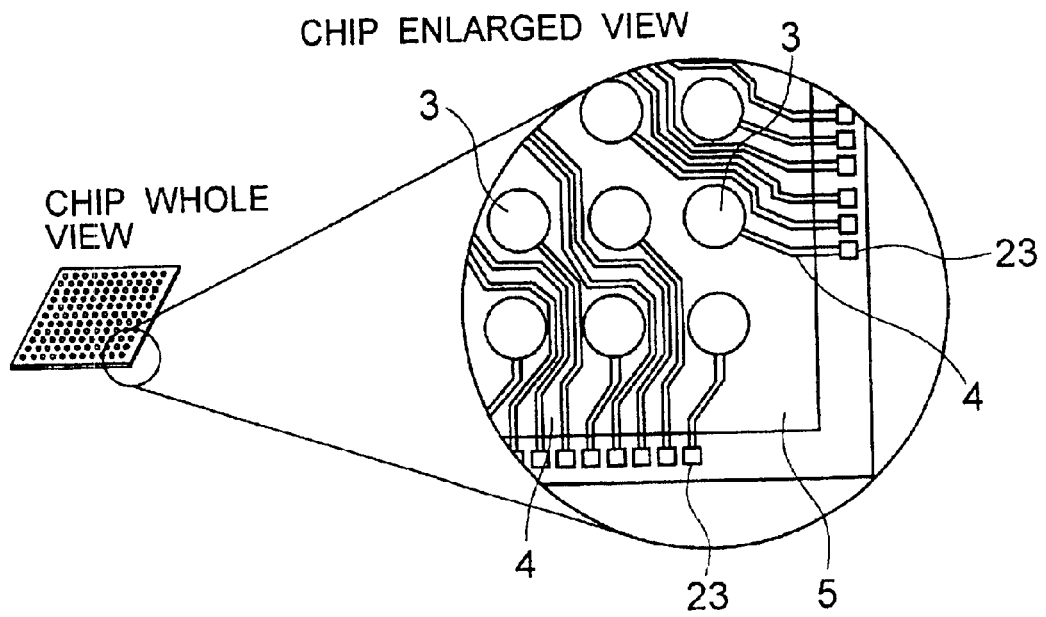
FIG. 11 is a chip general view and a chip enlarged view illustrating one example of the redistributing wire.

FIG. 11 shows a state in which a connection portion 23 to the aluminum pad and the bump pad 3 are connected through the redistributing wire 4. In the case of the exposure machine used in this embodiment, the screen gap below the exposure mask as shown in the column of Table 1 approximately corresponds to the thickness of the stress relaxation layer. Hence, for example, at the 60 micrometers thick stress relaxation layer, resolution will be possible up to 25 micrometers in terms of the line width. Hence, wiring may be made so that the line width of a signal line is 25 micrometers and the line width of a power or ground line is 40 micrometers alternately, wiring may be made so that the line width of a signal line is 25 micrometers but partially thickened.

Figure 12:
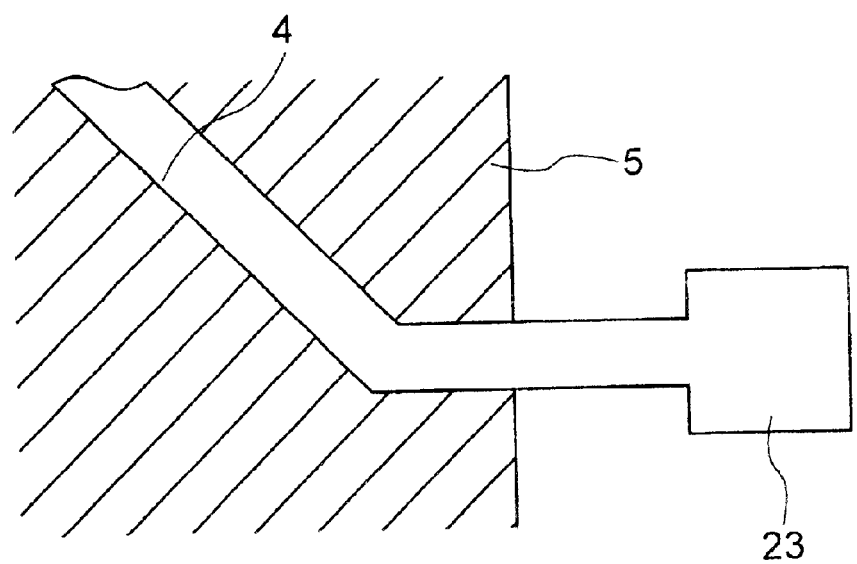
FIG. 12 is a plan view illustrating one example of the redistributing wire.
Figure 13:
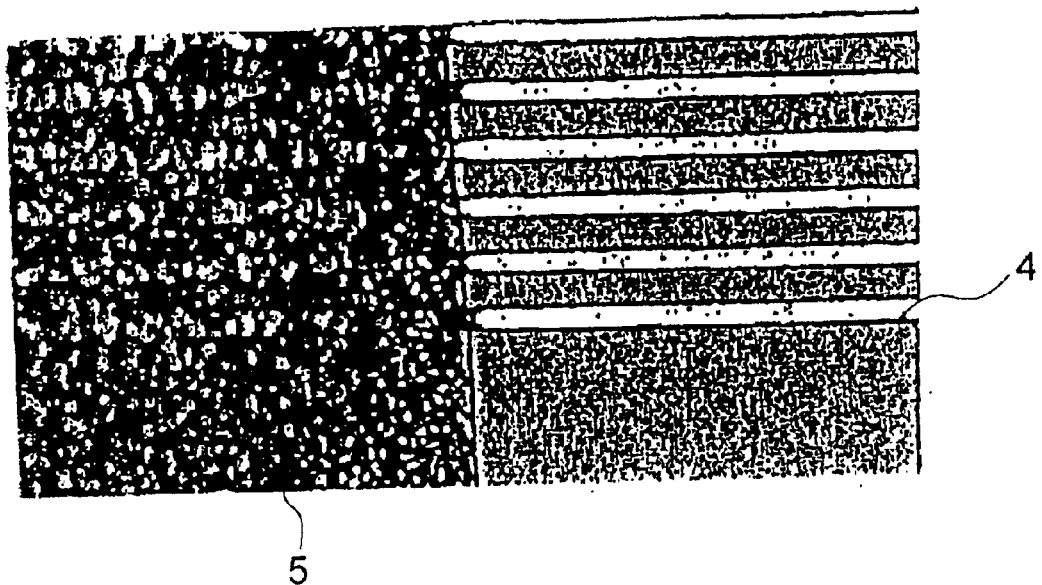
FIG. 13 illustrates a state of imperfect development in the actual redistributing wire.

FIG. 12 is an enlarged view of the redistributing wire 4 in the vicinity of the inclined portion of the stress relaxation layer 5. As described above, the film thickness of the resist becomes uneven in an area near the edge portion of the stress relaxation layer 5. Hence, there is a tendency that failure of developing is apt to happen in the area. FIG. 13 shows a state in which failure of developing actually happens in the edge portion of the stress relaxation layer 5. In this embodiment, the circulation of a developing solution is improved to thereby solve this problem of imperfect developing. To illustrate more specifically, measures to change the wiring pattern shape as shown in FIG. 14 or 15 may be taken.

Figure 14:
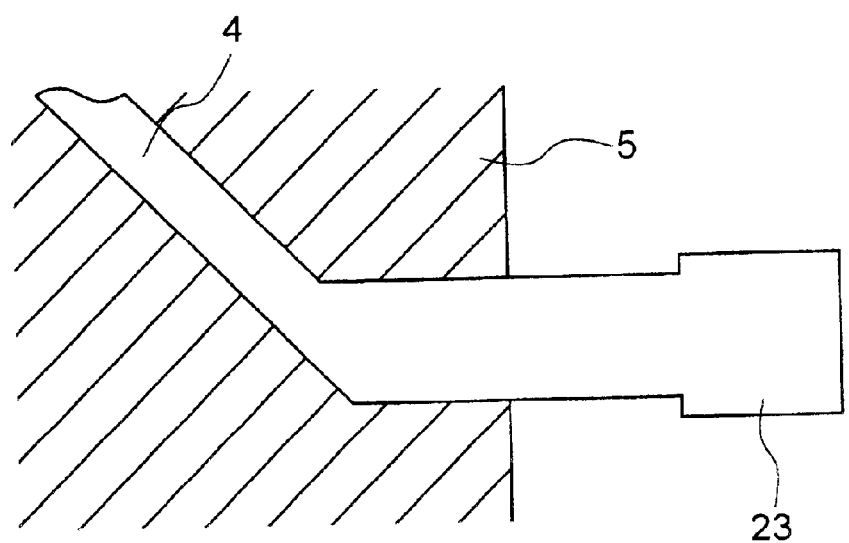
FIG. 14 illustrates another example of a redistributing wire different from that of FIG. 12.
Figure 15:
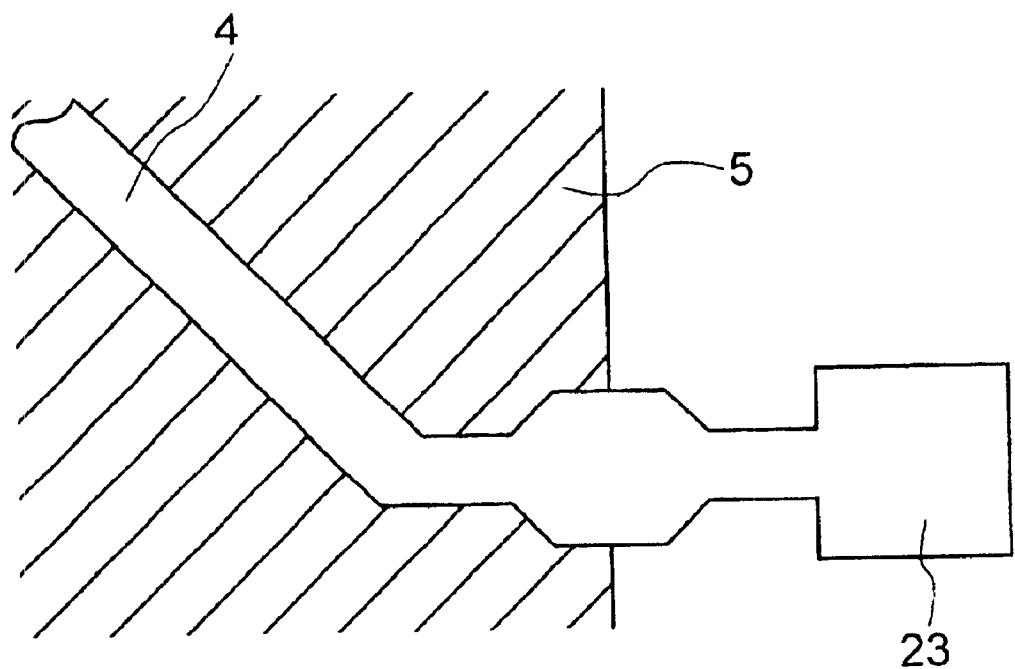
FIG. 15 illustrates yet another redistributing wire different from those of FIG. 12 and FIG. 14.

FIG. 14 shows the case where the line width is thickened in an area of from the connection portion 23 with the aluminum pad to a place near a vertex of the stress relaxation layer 5. FIG. 15 shows the case where the line width is thickened only in the edge portion of the stress relaxation layer 5 which is apt to be low in resolution. Incidentally, the line width in FIGS. 14 and 15 is determined in consideration of the thickness of the stress relaxation layer 5 and the resolution characteristic shown in Table 1. As another measure to solve the problem of imperfect developing, it seems that a method of elongating the developing time to thereby eliminate imperfect developing. Further, because light is diffracted at the mask surface, lowering of resolution or lowering of patterning accuracy may be induced by the presence of the screen gap 20 under the exposure mask 21.

Examples of measures to eliminate the above phenomenon include (1) alteration of the optical system in the exposure machine, (2) improvement in bleaching characteristic of the resist, (3) optimization of the pre-baking condition of the resist, (4) multistageous exposure, and so on. As a specific example of alteration of the optical system in the exposure machine, a measure uses an exposure machine having a numerical aperture value in a range of from 0.0001 to 0.2. Besides the aforementioned examples, known arrangements on process may be used suitably in combination so that patterning resolution and patterning accuracy can be improved.

Figure 16:
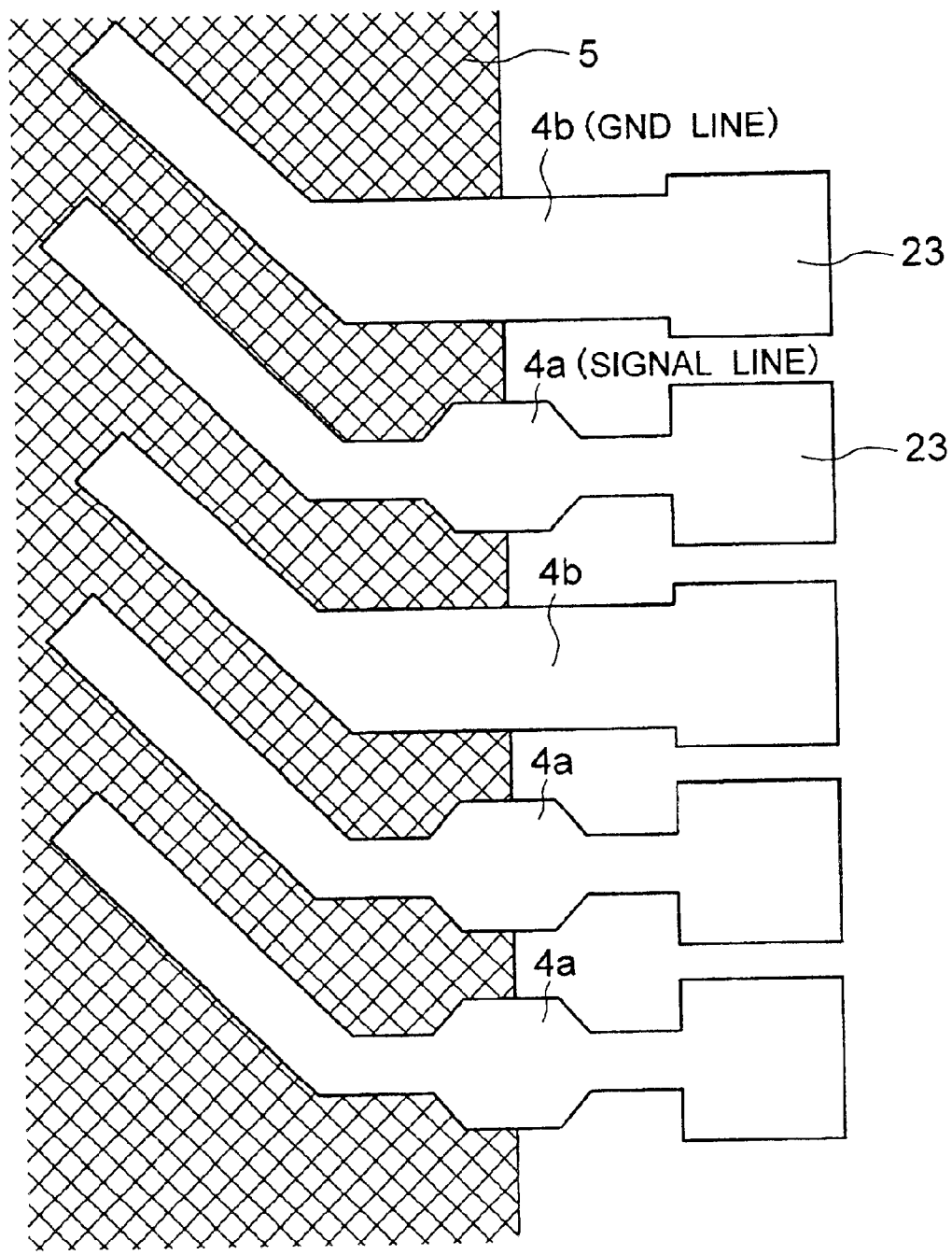
FIG. 16 illustrates one example in which a variety of wirings for redistribution are formed.

The edge portion of the stress relaxation layer 5 has structural characteristics in that stress induced by difference in physical values between the wafer and the stress relaxation layer 5 is concentrated into the edge portion of the stress relaxation layer 5. Therefore, the line width in the inclined portion of the stress relaxation layer 5 may be thickened to effectively prevent the line from being broken. Incidentally, all the line width need not always be made equal. For example, as shown in FIG. 16, the line width of a power/ground line and the line width of a signal line may be made different from each other. In this case, it is generally preferable that the width of the power/ground line is thickened greater than that of the signal line in terms of electrical characteristics. This is because an increase in width of the signal line brings increase of the capacitance component of the line to thereby exert a bad influence in a high-speed operation. On the other hand, thickening in width of the power/ground line is preferably expected to bring an effect of stabilizing a power supply voltage. Hence, as shown in the drawings, it is preferable that the signal line is provided as such a shape that the width of the signal line is thickened around the edge portion to relax the stress in the portion suffering concentration of stress as large as possible whereas the width of the power/ground line is provided as such a shape that the width of the power/ground line is thickened uniformly in the inclined portion. On the other hand, on the flat portion in which the stress relaxation layer is not formed, the width of the signal line is thinned in consideration of the influence of the capacitance component of the line. The line width is, however, necessary to be considered again whenever the kind of the semiconductor device or the line pattern thereof is changed. An increase of the thickness of the protective film 8 has a great effect of reducing the capacitance of the line though the effect also depends on the kind of the semiconductor device and the line pattern thereof. When, for example, the width of the signal line cannot but be thickened in the flat portion in which the stress relaxation layer is not formed, it is preferable that the protective film 8 is thickened. Specifically, when the line width is increased by 10%, it is preferable that the thickness of the protective film 8 is also increased by about 10%. On the other hand, the line width in the flat portion above the stress relaxation layer is limited by the line density rather than the signal line capacitance. That is, the upper limit value of the line width in the flat portion above the stress relaxation layer is determined on the basis of the number of lines to pass through the interval between bump pads, the diameter of each bump pad, the positioning accuracy in the line-forming process, etc. To illustrate specifically, when three lines are to be drawn between bump pads which are disposed at an interval of 0.5 millimeters and each of which has a pad diameter of 300 micrometers, the upper limit value of the line width is calculated as (500−300)/(3×2−1)=40. From a result of the calculation, the average line width and the line space in this embodiment are selected to be 40 micrometers.

The fifth step will be described below. In this embodiment, copper plating is performed by use of a copper sulfate plating solution. Copper electroplating is performed under the condition that the power supply film 16 is connected to a cathode and a copper plate containing phosphorus is connected to an anode after cleaning with a surface active agent, washing with water, cleaning with dilute sulfuric acid and washing with water.

Nickel electroplating is performed next. Incidentally, if cleaning with a surface active agent, washing with water, cleaning with dilute sulfuric acid and washing with water are performed before nickel electroplating, there is a tendency that a nickel electroplating film excellent in film quality can be obtained easily. Nickel electroplating is performed under the condition that the power supply film 16 is connected to a cathode and a nickel plate is connected to an anode. Known nickel plating bath such as a Watts type bath or a sulfaminic acid type bath can be used for nickel electroplating adapted for the embodiment. In this embodiment, plating is performed in a Watts type bath under the plating condition that the internal stress of the plating film is adjusted to be in a proper range. The sulfaminic acid type bath has an advantage that stress of the resultant plating film can be controlled easily while it has, at the same time, a disadvantage that a plating liquid composition is expensive and shows a tendency to be decomposed slightly easily in comparison with the Watts type bath. On the other hand, because the stress of the plating film in the Watts type bath is generally apt to become high, the Watts type bath has a disadvantage that a risk of cracking of the wiring layer is increased due to stress (tensile stress) of the resultant plating film per se when thick-film plating is performed. Although the Watts type bath is used in this embodiment, it is preferable that a model experiment is performed in advance in order to obtain proper ranges of the kind and concentration of additives (plating film stress suppressor), the plating current density and the plating solution temperature before the Watts type bath or the sulfaminic acid type bath is used to perform Nickel electroplating. In this embodiment, Nickel electroplating is performed after the condition that these proper ranges are controlled suitably to prevent the line from cracking with the film thickness of not larger than 10 micrometers is obtained in advance.

Incidentally, the plating film stress is one of indices concerning metal crystal direction of deposited nickel. It is necessary to control the plating film stress properly in order to suppress the growth of an interfacial intermetallic layer which will be described later. When plating is performed under the condition that the film stress is controlled properly, specific amounts of trace components are co-deposited in the plating film. For example, in the case of a film containing of sulfur in a range of from 0.001 to 0.05%, the content of specific crystal oriented faces is increased. More specifically, the total content of oriented faces 111, 220, 200 and 311 is increased to be not smaller than 50%.

The optimum value of the thickness of the nickel electroplating film is determined in accordance with the kind of solder and the reflow condition to be used in a post-process, and the characteristic (the structure of the assembled module) of a semiconductor device. Specifically, the optimum value may be determined so that the thickness of an alloy layer which is formed of solder and nickel at the time of solder reflow or mounting repair is not smaller than the thickness of the nickel plating film. The thickness of the alloy layer increases as the concentration of tin in solder increases. Besides, the thickness of the alloy layer increases as the upper limit in reflow temperature increases.

When the nickel layer is formed on a copper wire as the redistributing wire in the aforementioned manner, the redistributing wire is deformed due to thermal stress acting between the semiconductor device and the circuit substrate. When the stress is released thereafter, the deformed shape of the redistributing wire can be restored to its original state by spring characteristic of the nickel layer.

For example, the stress relaxation layer and the redistributing wire 4 formed on the stress relaxation layer are deformed due to the action of thermal stress induced by an operation of the semiconductor device in the state in which the stress relaxation layer is in close contact with the redistributing wire 4. The flexible portion in the redundant portion of the redistributing wire disposed in the protrusive portion of the stress relaxation layer is used for the deformation of the redistributing wire. If the redistributing wire is constituted by a copper wire alone, the deformed shape of the copper wire is hardly restored to its original state by spring characteristic of the copper wire per se when the deformed shape of the stress relaxation layer is released from the thermal stress, or the like, so as to be restored to its original state after the deformation. On the other hand, if a nickel layer is formed on the copper wire, the deformed shape of the redistributing wire (copper wire) can be easily restored to its original state by spring characteristic of the nickel layer. Incidentally, the layer formed on the copper wire is not limited to the nickel layer. Any layer may be used so long as the layer can exhibit spring characteristic to the similar degree as that of the nickel layer formed on the copper wire. In addition, the nickel layer is not always required if the copper wire is replaced by a flexible wire.

In the sixth step, the resist 17 to be a reverse pattern to the wiring is removed after copper electroplating and nickel electroplating are performed. Then, etching is performed to remove the power supply film 16 formed in advance.

An etchant such as a ferric chloride solution or an alkaline type solution, may be used for etching copper. In this embodiment, an etchant containing sulfuric acid/hydrogen peroxide as the main components was used. If the etching time is shorter than 10 seconds, there is a disadvantage from the viewpoint of practical use because etching can hardly be controlled. If the etching time is too long, for example, longer than 5 minutes, there is a problem that side etching is made large or a design cycle time is made long. Hence, it is preferable to select the etchant and the etching condition on the basis of suitable experiments. In this embodiment, the chromium portion of the power supply film 16 is etched next by an etchant containing potassium permanganate and metasilcate as the main components. Incidentally, the nickel electroplating film serves also as an etching resist when the power supply film 16 is etched. Hence, it is preferable that the composition for the etchant and the etching condition are determined in consideration of the etching selection ratios between nickel and copper, and between nickel and chromium. Specifically, for example, it is preferable that the content of sulfuric acid in the sulfuric acid/hydrogen peroxide etchant used for etching copper is selected to be not larger than 50% at maximum, more preferably not larger than 15%. Thus, copper can be etched at an etching selection ratio of about 10 times as large as that for nickel.

In the seventh step, the surface protective film 6 having openings on the bump pad 3, the dicing area 24 and the vicinity of the dividing area is formed. Electroless plating is then performed to thereby form a gold film on the bump pad portion 3. In this step, a solder resist is used as the surface protective film 6. After the solder resist is applied onto the whole surface of the semiconductor device 13, the solder resist is subjected to exposure and development to form a pattern. Any material other than the solder resist such as photosensitive polyimide or printing polyimide may be also used for forming the surface protective film 6.

When the aforementioned steps are completed, the redistributing wire 4, the stress relaxation layer 5, the protective film 8, etc. are entirely covered with the surface protective film 6. Hence, the surface protective film 6 can prevent the redistributing wire 4, the stress relaxation layer 5 and the protective film 8 from being spoiled, peeled and corroded by stimulant substances. Since the material used as the surface protecting film 6 is required to have characteristic properties as a final protecting film, the elongation at break in the neighborhood of ambient temperature (about 20° C.) must be at least 3% and preferably more than 10%. When a material of which elongation at break is smaller than 3% is used, cracks are readily formed on the surface due to various shocks and stress arising in the manufacturing processes, in the handlings at the time of a circulation as package, or in the conditions of use after setting into instruments, and there is a risk that the function as a final protecting film may be partially lost. On the other hand, when the elongation at break is greater than 10%, the risk of the above-mentioned crack formation is low, so that there is no particular problem in the practice of this embodiment, but it is generally desirable that the elongation at break is 200% or less. Materials of which elongation at break exceeds 200% are often inferior in heat resistance and weather resistance, and hence it is more preferable to use materials of which elongation at break is 100% or less.

Further, the final protecting film 6 is also required to have another function of securing the adhesion reliability to the under layer. Accordingly, it is necessary to take a measure so that film-forming process of surface protecting film 6 does not injure the adhesion characteristics of the material. In this embodiment, optimization of curing flow is carried out for this purpose. More specifically speaking, the measure includes (1) adoption of curing flow consisting of multi-step temperature hierarchy, (2) optimization of curing period at the final curing temperature, etc. More concretely, the measures mentioned above are appropriately combined with hitherto known conventional means, in view of adhesion test results after exposing to pressure cooker test conditions.

When the seventh step is completed, the redistributing wire 4 in an area from the aluminum pad 7 to the bump pad 3 and the bump pad 3 are formed on the wafer 9 having semiconductors formed thereon, as shown in FIGS. 17 and 2.

In the eighth step, the bump is formed by use of a solder ball mounting machine and a reflow furnace. That is, one solder ball together with a predetermined amount of flux is mounted on one bump pad 3 by use of the solder ball mounting machine. As the solder ball, lead-free solder balls are preferably used. On this occasion, the solder ball is temporarily fixed onto the bump pad by adhesive power of the flux. When the semiconductor wafer having solder balls mounted thereon is put into the reflow furnace, the solder balls are once melted and then solidified again. As a result, the bump 1 connected to the bump pad 3 is formed as shown in FIG. 1. As another method to form the bump 1, there is a method in which a solder paste is printed on the bump pad 3 by a printing machine and then reflowed to thereby form the bump 1. In the above methods, any suitable material for solder ball can be selected. Hence, most of solder materials available on the market at the present time can be used. As a further method to form the bump 1, there is a method using a plating technique for forming the bump 1 while the solder material used in the method is limited. Alternately, the bump may be formed from a ball containing gold or copper as its core, or, the bump may be formed of a resin mixed with an electrically conducting material.

When the process from the first step to the ninth step is completed, there can be achieved the semiconductor device 13 having the stress relaxation layer 5 shown in FIG. 1 and the redistributing wire 4 formed in a small number of steps without forming any bent portion suffering concentration of stress along the redistributing wire 4. Further, by use of the printing technique, the stress relaxation layer 5 can be patterned as a thick-film electrically insulating layer without use of any exposure and developing technique. The stress relaxation layer 5 can have an inclined surface for forming the redistributing wire 4.

According to this embodiment, the reliability of bonding of the semiconductor device 13 is improved greatly even in the case where the semiconductor device 13 is subjected to flip chip bonding without any underfill.

Hence, according to this embodiment, flip chip bonding without any underfill can be applied to most of electrical appliances. It is found that the cost for producing each electrical appliance can be reduced.

Moreover, because no underfill is used, the semiconductor device 13 can be removed. That is, when the semiconductor device 13 connected to the circuit substrate is defective, the semiconductor device 13 can be removed from the circuit substrate so that the circuit substrate can be recycled. Hence, the cost for producing each electrical appliance can be also reduced.

The package 13 (semiconductor device) of the present invention mentioned above is so constructed that, as shown in FIG. 21, a stress relaxation layer 5 is provided under the connection bump 1 which is connected to circuit substrate 14, and the thermal stress-inducing strain applied to bump 1 is transferred to stress relaxation layer 5 through the bottom of bump 1. That is, characteristic feature of the semiconductor device 13 according to the present invention consists in that, after a stress simulation experiment has revealed that the thermal stress is concentrated into up and under portions of bump 1, the structure has been so constructed in such a manner that the stress can directly and effectively be relaxed at a portion under the bump into which the stress is concentrated. As above, the material composition of the stress relaxation layer is so devised as to ingeniously utilize the structural characteristic feature of the package (semiconductor device) of the invention. That is, the material constituting the stress relaxation layer 5 of the invention is so designed as to have a lower elastic modulus as compared with that of the underfill resin and, as its result, the thermal stress applied to bump 1 can be relaxed smoothly. The material constituting the stress relaxation layer 5 preferably has an elastic modulus of about 0.1 to about 10.0 GPa at ambient temperature, and materials of which elastic modulus is lower than that of conventional cured polyimide resin are further preferable. Elastic modulus of usual underfill resin is higher than that of conventional cured polyimide resin. When elastic modulus of the material constituting the stress relaxation layer 5 is so small as lower than 0.1 GPa, the wiring portion is readily deformed and break of wiring is feared at the time of forming the protruded electrode (mentioned later) or testing the function of the semiconductor device. When elastic modulus of the stress relaxation layer 5 is so high as exceeding 10.0 G, no sufficient stress-reducing effect can be obtained and a decrease in connection reliability is feared after mounting the semiconductor device 13 on substrate 14.

Further, in the semiconductor device of the present invention, the order or procedures in the resin layer forming step is ingeniously devised in order to sufficiently utilize the above-mentioned characteristic features of package structure and material properties. That is, as has been mentioned above, in this embodiment, stress relaxation layer 5 is formed and cured before formation of the redistributing wire. As its result, at the time of forming the stress relaxation layer 5, the redistributing wire 4 and bump 1 are still in a state that their upper sides are exposed prior to a formation thereof. In such a state, the accumulation of internal stress in the stress relaxation layer 5 is small, and deformation of bump due to internal stress of resin does not take place.

Further, examples of the material constituting the stress relaxation layer 5 of this embodiment will be explained specifically. That is, temperature cycle tests on semiconductor device 13 of the present invention has revealed that whether the material constituting the stress relaxation layer 5 is a thermoplastic resin or a thermosetting resin, the results of the test are comparable as shown in the following Table 2.

TABLE 2

| No. | Material of stress relaxation layer | Testing conditions | Number of tested samples | Number of cycles allowing formation of defectives |
|---|---|---|---|---|
| 1 | Thermoplastic *1 | −55° C./ 125° C. | 45 | >1,000 |
| 2 | Thermosetting *1 | | 45 | >1,000 |
| 3 | None *1 | | 20 | 100 |
| 4 | None *2 | | 20 | >1,000 |

*1 No underfill used
*2 Underfill used

It is apparent from Table 2 that, in a case of using no stress relaxation layer 5 and no underfill, defective product appears in a fairly early stage (No. 3), while in a case of using a stress relaxation layer 5 (Nos. 1 and 2), good results are obtained even if no underfill is used. This result is equal to that obtained in a case of using no stress relaxation layer and using underfill (No. 4), so that it is understandable that the effect and function of stress relaxation layer 5 are the equivalent to those of underfill.

Preferably, the material constituting the stress relaxation layer 5 is selected from materials having a glass transition temperature Tg and melting temperature Tm which have been selected with consideration of the maximum attainable temperature Tmax (about 350° C.) in the steps not earlier than the stress relaxation layer-forming step. More concretely speaking, it is preferable that a specified relation exists between the maximum attainable temperature Tmax through the sputtered film-forming step for contacting wiring 4 with surface of stress relaxation layer 5, the surface protecting film (cover coat layer)-forming step and the solder reflow step and the glass transition temperature Tg and melting temperature Tm of the material constituting the stress relaxation layer 5.

Figure 22A:
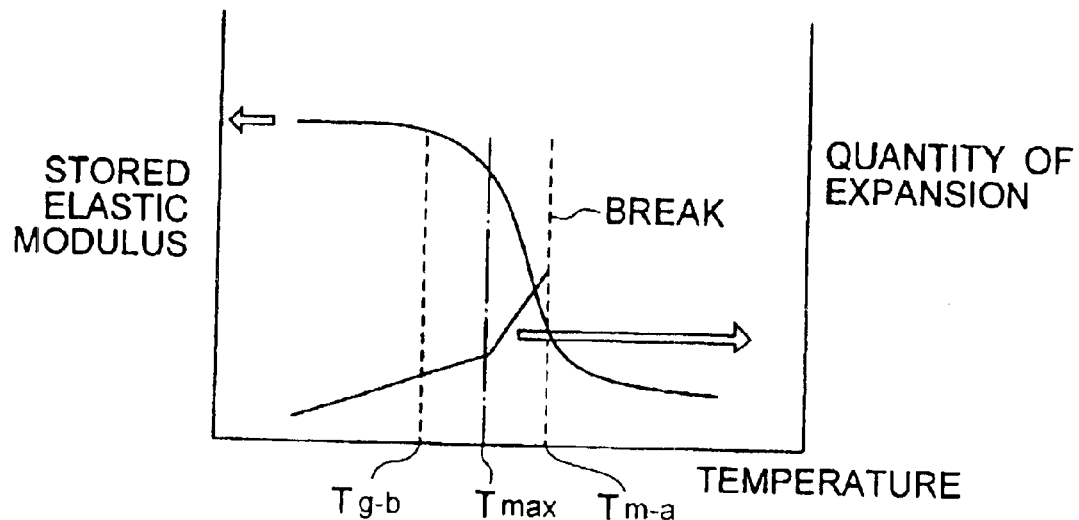
FIG. 22 illustrates the characteristics properties in a case where thermoplastic resins A and B are used as a material of a stress relaxation layer according to the present invention.

Essentiality of the above-mentioned thought will be described below with reference to FIG. 22 to FIG. 24 to explain the basis thereof. FIGS. 22(a), (b) and FIGS. 23(a), (b), (c) are graphs illustrating the dynamic viscoelastic property (storage elastic modulus) and thermo-mechanical property (TMA) (quantity of expansion) of five materials A, B, C, D and E.

Figure 22B:
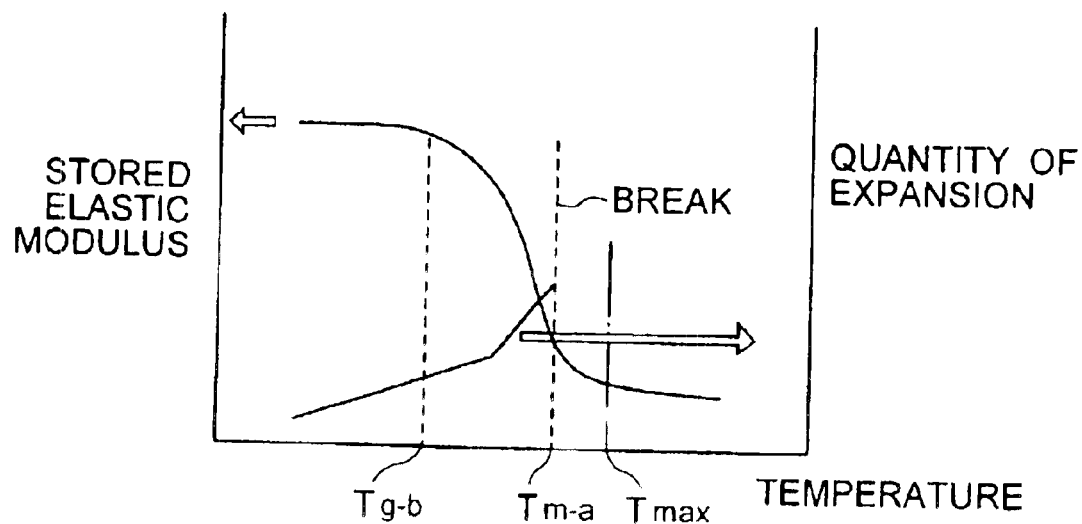

The material shown in FIG. 22(a) is a thermoplastic material of which melting temperature Tm-a is higher than the maximum attainable temperature Tmax of the process (about 350° C.). That is, the material shown in FIG. 22(a) is a material in which the maximum attainable temperature Tmax in the process is between glass transition temperature Tg-a and melting temperature Tm. The material shown in FIG. 22(b) is a thermoplastic material of which melting temperature Tm-b is lower than the maximum attainable temperature Tmax of the process. The materials A and B are both thermoplastic materials, and their melting temperature satisfy Tm-a≧Tmax and Tm-b<Tmax, respectively. Accordingly, in FIG. 22(b), the thermoplastic material B satisfies Tm-b≦Tmax and hence has a problem that break of the resin takes place in the course of the process, so that it is unusable as a material of stress relaxation layer. On the other hand, in FIG. 22(a), the thermoplastic material A satisfies Tm-a>Tmax and hence no break of resin takes place in the course of the process.

In the case of thermoplastic materials, materials which have been made into a high polymer are used and hence it is not difficult to give a constant film strength to the film made therefrom. However, film strength thereof markedly decreases in the temperature range near to the glass transition temperature Tg or exceeding Tg. In this embodiment, the problem of decrease in strength is solved by adopting a process temperature while giving a consideration to glass transition temperature Tg and melting temperature Tm, as shown in FIG. 22(a).

On the other hand, in the case of using a thermosetting material mentioned later, a constant film strength is often unrealizable when the process stability of curing (thermal uniformity or the like) is low, because thermosetting resin materials are generally made into a film in the state of low molecular weight substance. So far as the process is properly controlled, however, a film made therefrom exhibits a sufficient strength at a temperature not exceeding glass transition temperature Tg, and it is also possible to prevent the decrease in strength even in the temperature range exceeding Tg.

That is, in the case of using a thermoplastic material as a material of stress relaxation layer 5, the varnish used therein is an unreactive varnish which has already completed cure. Although such varnishes are usually put to use after dissolution in a solvent, a solventless varnish coating is practicable only by melting the material at a high temperature. A considerably high temperature is required for the melting because the thermoplastic material has already formed a high polymer.

As the method for forming a film from such thermoplastic materials, a method of coating a varnish and thereafter removing the solvent present in the varnish by heating and evaporation, and a method of coating a molten resin and thereafter cooling the coat can be referred to.

As above, in the case of thermoplastic materials, a constant strength can be obtained easily because the material used therein is already in the form of a polymer. However, in such a case, the strength shows a marked decrease in the temperature range near to the glass transition temperature or exceeding it. This embodiment is free from the problem of decrease in strength because the process temperature is adopted while considering glass transition temperature Tg and melting temperature Tm. Further, in the case of using a thermoplastic material, a solution or a melt of a polymer which has already completed the cure before film formation is used, and hence no considerable progress of the chemical bonding reaction between the superficial molecules of coated surface and the coating film can be expected, and the strength of contact bonding is not always high. In this embodiment, however, thermoplastic materials are made usable by ingeniously devising the surface property of the material to be coated therewith. Concretely speaking, a specific contact bonding-accelerating compound is added to the protecting film 8 serving as contact surface, or the shape (irregularity) of surface is property controlled. Further, when an organic-protecting film 8 is used, a varnish of thermoplastic resin is prepared by using a solvent which can swell the protecting film 8. By such means, a high contact bonding property can be secured after application of a thermoplastic resin, which is by the following mechanism: (1) the solvent diffuses into the protecting film 8 to increase the distance between the organic molecules constructing the protecting film 8 or, in other words, the surface of protecting film 8 is swollen, (2) the thermoplastic molecules invade the interstices between the molecules of protecting film 8, and (3) then the solvent is distilled away in the process of heat-cure and the swollen protecting film is baked or constricted. Further, it is also possible to maintain a reactivity with the surface of protecting film 8 by leaving unreacted a part of the thermoplastic resin material or by adding other thermosetting component thereto.

In FIGS. 23(a), (b) and (c), the materials C, D and E are all thermosetting materials having no melting point Tm. The thermosetting material C shown in FIG. 23(a) is a material of which glass transition temperature Tg-c is comparable to or higher than the maximum attainable temperature Tmax of the process. The material D shown in FIG. 23(b) and the thermosetting material E shown in FIG. 23(c) are materials of which glass transition temperatures Tg-d and Tg-e are both lower than the maximum attainable temperature Tmax of the process. The term "comparable" used herein means that the difference is about ±20° C.

The materials C to E shown in FIG. 23(a) to (c) are thermosetting materials, none of which undergo break in the course of the process. The material E having a low Tg and a great coefficient of thermal expansion (α2) at a temperature higher than Tg shows a great deformation in the process of manufacture, so that it not practically usable from the viewpoint of register and handling in the process. For instance, due to elevation of temperature in the course of sputtering, the shape in the early stage of film-forming step is different from that at the end of film-forming step, and failure in film formation is apt to occur. Accordingly, application of material E to the present invention is undesirable.

As above, the material used for constituting the stress relaxation layer 5 may be any of thermo-plastic resin and thermosetting resin, and any of them can be used in accordance with conditions of use. However, if the formation of swelling portion 34 shown in FIG. 9 etc. is taken into consideration, the use of a thermoplastic resin is preferable to the use of thermosetting resin because of difference in curing mechanism between them. That is, in a thermoplastic resin, a film is formed by applying a varnish and then the coat is cured by removing the solvent therefrom by the method of heating or the like, due to which the shape of film or the shape of swelling portion 34 formed in the process of printing is maintained during the curing process. Hitherto, such solvent type thermoplastic resins have not been used generally because the volatile material present in the varnish causes formation of voids. On the other hand, according to this embodiment, a thermoplastic resin is applied and cured on a semiconductor device while keeping open the upper side of the semiconductor device and, even if the used thermoplastic resin contains a large quantity of solvent, the solvent can be vaporized off through the upper side so that no problem arises unlike in the prior art. Additionally speaking, thermoplastic resins can be classified into (1) solvent type in which the resin made into a varnish by the use of a solvent is applied and then the solvent is vaporized off and (2) melting type in which a melted resin is coated and thereafter it is cooled, and it is needless to say that the use of solvent type thermo-plastic resin is preferable to the use of melting type one for the reason mentioned above. The latter type, or the melting type of thermoplastic resin, is undesirable because its melting also requires a considerably high temperature which causes storage of a large internal stress due to the difference in thermal expansion.

The formation of swelling portion 34 is not dependent on the above-mentioned Tg and Tm.

When a thermoplastic resin is used, a solution or a melt of a polymer which has already completed a curing reaction prior to film formation is used. Accordingly, no considerable progress of the chemical bonding reaction between the superficial molecules of coated surface and the coating film can be expected, and the strength of contact bonding is not always high. Thus, when an organic protecting film 8 is used in this embodiment, the solvent used is preferably a solvent which can swell the protecting film 8, namely a solvent of which solubility parameter (SP value) is in the range of 8 to 20 $(cal/cm^3)^{1/2}$. More specifically, solvents comprising at least an alicyclic amide compound or a 5 to 8-membered lactone are preferable. For instance, N-methylpyrrolidone and gamma-butyrolactone are preferable. Although they are other than alicyclic amide or 5 to 8-membered lactone, dimethylformamide, dimethylacetamide and dimethyl sulfoxide are also usable. A vanish of a thermoplastic resin is prepared by the use of these solvents. If such a thermoplastic resin is used for coating, a high contact bonding property can be secured by the following mechanism: (1) the solvent diffuses into the protecting film 8 to increase the distance between the organic molecules constructing the protecting film 8 and the surface of protecting film 8 is swollen, (2) the thermoplastic resin molecules invade the interstices between the molecules of protecting film 8, (3) and then the solvent is distilled away in the process of heat-cure and the swollen protecting film is baked or constricted.

It is also possible to add a specific contact bonding-accelerating compound such as a silane coupler to the protecting film 8 or to form irregularities on the surface.

It is also possible, if desired, to maintain a reactivity with the surface of protecting film 8 by leaving unreacted a part of the thermoplastic resin material or by adding other thermosetting component thereto.

The thermoplastic material and thermosetting material used as a material for the stress relaxation layer preferably has a curing temperature ranging from 100° C. to 250° C. If the curing temperature thereof is lower than the above, the material is difficult to control in the process for manufacturing a semiconductor. If the curing temperature is higher than the above, the stress in the wafer increases due to thermal contraction upon the cooling after cure, or the characteristic properties of the semiconductor element can change.

After the cure, namely after the stress relaxation layer-forming step, the stress relaxation layer 5 is subjected to various treatments such as sputtering, plating, etching, etc.

as has been mentioned above. Accordingly, the stress relaxation layer is further required to be heat-resistant, chemical-resistant, and solvent-resistant.

Specifically, in the thermoplastic resin material and thermosetting material used as a material of stress relaxation layer, the heat resistance as expressed in terms of glass transition temperature (Tg) is preferably higher than 150° C. and not higher than 400° C., more preferably 180° C. or above, and most preferably 200° C. or above.

If Tg of the material is higher than 400° C., no practical material having such a low elastic modulus as expected is available. Accordingly, an upper limit of 400° C. is adopted herein. The reason why the lower limit is 150° C. is shown in FIG. 25 and FIG. 26.

Figure 25:
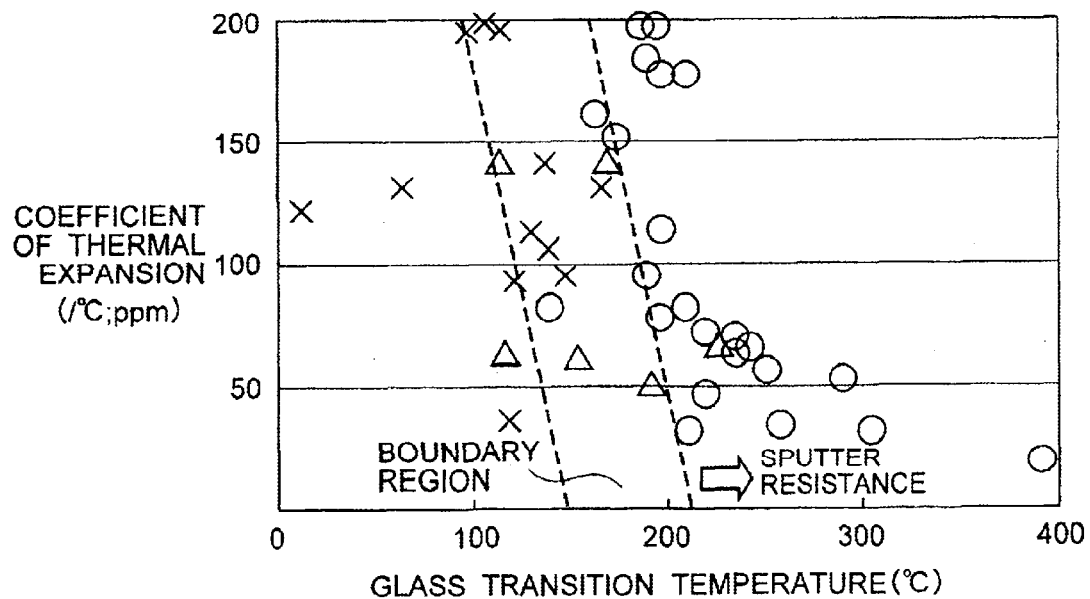
FIG. 25 illustrates characteristic properties and sputter resistances of the materials which may be used as a material of the stress relaxation layer.
Figure 26:
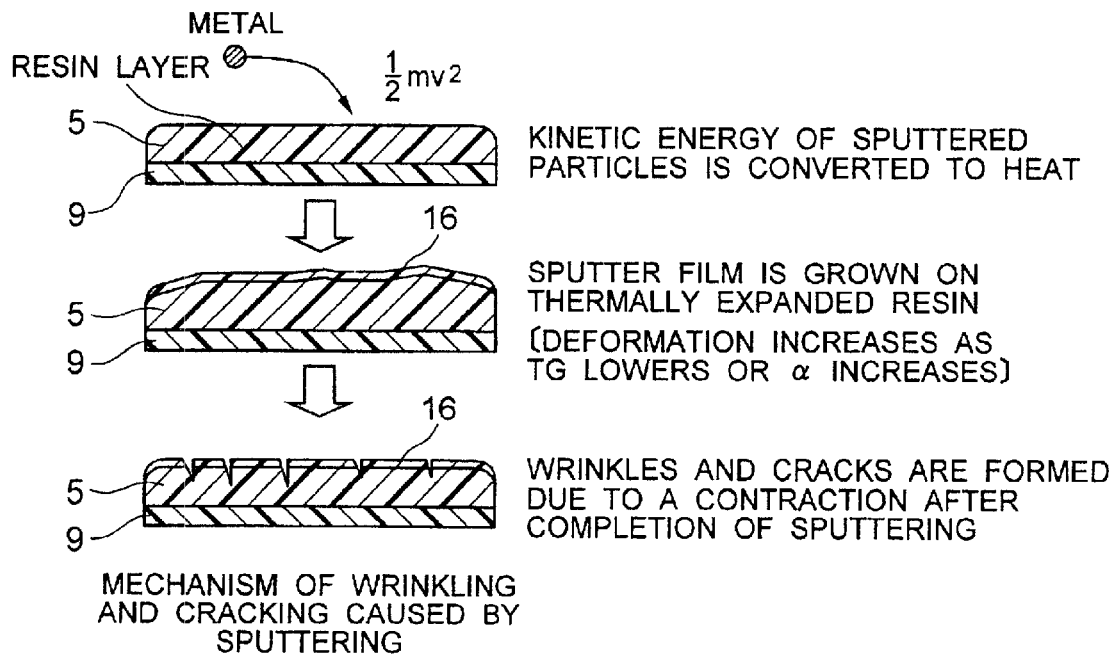
FIG. 26 illustrates the mechanism of formation of wrinkles and cracks caused by sputtering.

FIG. 25 illustrates results of an experiment on the possibility of crack formation in the sputtered film during the process of sputtering, wherein the graph expresses the physical properties, namely coefficient of thermal expansion and glass transition temperature, of stress relaxation layer 5. It is apparent from the graph that the possibility of crack formation is lower as the glass transition temperature becomes higher, and the sputtering-resistance becomes lower as the coefficient of thermal expansion becomes higher.

This is for the following reason. Thus, as shown in FIG. 26, in the sputtering process, the sputtering particles collide against the resin layer (stress relaxation layer) 5, when the kinetic energy thereof is converted to heat to cause expansion of the resin. Thereafter, a sputtered film is grown on the thermally expanded resin. After completion of the sputtering, the resin contracts. At this time, a resin showing a greater thermal expansion on the sputtered film shows a greater contraction, so that a sputtered film which has been formed on a thermally more expanded resin forms wrinkles and cracks more readily. A resin having a lower glass transition temperature and a greater coefficient of thermal expansion is deformed more readily.

Accordingly, it is apparent from FIG. 25, from the viewpoint of preventing defective wiring formation at the time of sputtering, those resin materials which have a glass transition temperature of 150° C. or above are preferable because such resins give good products. Resins having a glass transition temperature of 180° C. or above are more preferable because when such a resin is used, most products are good. Resins having a glass transition temperature of 200° C. or above are further preferable, because when such a resin is used, all the products are good almost unexceptionally.

However, from the viewpoint of deformation occurring in the process, not only the thermoplastic materials but also the thermosetting materials are limited in the applicability to the present invention. More concretely speaking, it is preferable that, as exemplified by R and S in FIG. 24, the accumulated elongation (expansion) from the ambient temperature (about 20° C.) to the maximum temperature of the process Tmax, namely $\Sigma(\alpha(T) \times \Delta T)$, is about 10% or less. This is for the reason that, since wiring 4 made of copper or nickel having a length of at least 500 $\mu$m is formed on the surface of stress relaxation layer 5, the wiring 4 cannot follow the deformation (elongation) of the stress relaxation layer, which is about 10%, and stripping at the interface and cracking of resin occurs. Among the thermoplastic materials, materials satisfying the above-mentioned condition have specified coefficient of thermal expansion, Tg and dynamic viscoelastic property. Specifically, materials having a coefficient of thermal expansion of 200 ppm/° C. or less are preferable, and Tg thereof is preferably 150° C. or higher, as has been mentioned above.

Figure 24:
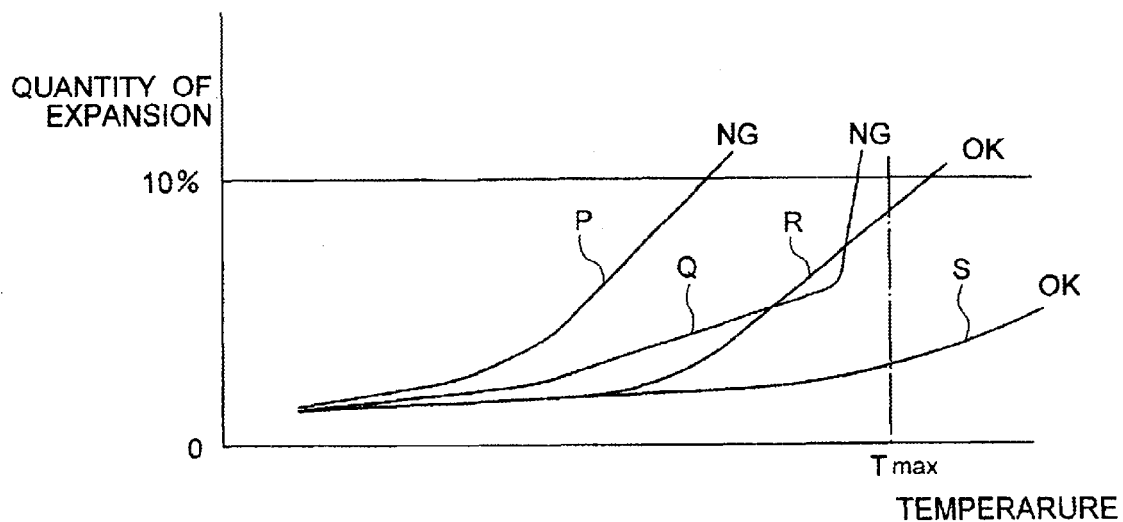
FIG. 24 illustrates the accumulated elongation (expansion) from ambient temperature (about 20° C.) to the maximum temperature Tmax in the process, for each case of using materials P to S as a resin material of the stress relaxation layer.

In FIG. 24, the materials P and Q are undesirable, because the accumulated elongation (expansion) from ambient temperature to the maximum temperature of the process (Tmax), namely $\Sigma(\alpha(T)\times\Delta T)$, is greater than 10%.

Contrariwise, it is also allowable, if desired, to lower the curing temperature in place of prolonging the curing time of the material constituting the surface protecting film 6, taking the physical property of stress relaxation layer material into consideration.

That is, in the thermoplastic material and thermosetting material as a material for stress relaxation layer, a smaller coefficient of thermal expansion ($\alpha$1) in the region not higher than Tg is more desirable from the viewpoint of making small the deformation caused by various heat treatments in the process. Specifically speaking, a coefficient of thermal expansion closer to 3 is more desirable. Generally speaking, low-elasticity materials have a great coefficient of thermal expansion, and the material used for constituting the stress relaxation layer 5 of this embodiment preferably has a coefficient of thermal expansion falling in the range of from 3 ppm to 300 ppm, and more preferably from 3 ppm to 200 ppm, and most preferably 3 ppm to 150 ppm.

On the other hand, in the thermoplastic materials and thermosetting materials used as a material of stress relaxation layer, the thermal degradation temperature (Td) is preferably 350° C. or above. If glass transition temperature Tg and thermal degradation temperature Td are lower than the above-mentioned value, there is a risk that a deformation, a quality change or a degradation of the resin may take place in the thermal processes such as sputtering, sputter-etching, etc. From the viewpoint of chemical resistance, it is preferable that no quality change of resin such as color change, deformation, etc. takes place when the resin is dipped in 30% aqueous solution of sulfuric acid or 10% aqueous solution of sodium hydroxide for 24 hours or more. As for solvent resistance, it is preferable that the solubility parameter (SP value) is in the range of from 8 to 20 $(cal/cm^3)^{1/2}$. In cases where the material for forming stress relaxation layer 5 is a material prepared by modifying a base resin with several components, it is preferable that most of the constituents thereof have a solubility parameter falling in the above-specified range. More concretely speaking, it is preferable that the content of constituents of which solubility parameter (SP value) is smaller than 8 or greater than 20 does not exceed 50% by weight.

When chemical resistance and solvent resistance do not satisfy the above-mentioned conditions, the production processes to which the present invention is applicable can be limited, which may be undesirable from the viewpoint of lowering the cost of manufacture. Actually, it is recommendable to select the material used for forming the stress relaxation layer 5 after giving a general consideration to where or not the costs of materials and the degree of freedom of the process can fulfil the above-mentioned conditions.

As concrete composition of the thermoplastic materials and thermosetting materials used for forming a stress relaxation layer mentioned above, a pasty polyimide can be referred to. However, the composition adoptable is not limited thereto, but modified amide-imide resins, ester-imide resins, ether-imide resins, polyester resins, modified silicone resins, modified acrylic resins and the like are also usable.

Among the resins mentioned above, resins having an imide linkage such as polyimide, amide-imide, ester-imide, ether-imide and the like have a solid skeletal structure of imide bonding so that they are excellent in thermo-mechanical properties such as strength at high temperature, etc. and, as its result, these materials have a broadened selectivity for the method of forming a plating electric power supply film for wiring. For instance, a plating electric power supply film forming method accompanied by a high-temperature treatment such as sputtering or the like can be selected. Some resins partially containing a condensed structure formed through a bonding other than imide bonding, such as silicone resin, acrylic resin, polyester resin, amide-imide resin, ester-imide resin, ether-imide resin and the like can be advantageous in processability and resin cost, even though they are somewhat inferior in thermo-mechanical properties. For instance, polyester-imide resin is easier to handle than polyimide because it is lower than polyimide in curing temperature. According to this embodiment, the above-mentioned resins are properly selected and put to use while giving a general consideration to characteristic properties of element, price, thermo-mechanical properties, etc.

Further, it is also possible to prepare a material for forming stress relaxation layer by selecting one member from epoxy resin, phenolic resin, polyimide resin, silicone resin and the like or a blended mixture of two or more members thereof, and adding thereto a coupler for improving adhesiveness to various interfaces, a colorant, or the like.

As has been described above, according to the present invention, the resin layer-forming step is carried out before the formation of wiring 4 and bump 1, due to which the formation of voids can be prevented, the results of temperature-cycle test can be improved, and the resin-forming time can be kept constant regardless of package size. The fact that the resin-forming time can be kept constant regardless of package size makes it possible to work the production line efficiently. For such a reason, the present invention is successfully applicable to mounting of a large-sized package (semiconductor device) 13 or, more concretely speaking, even to the mounting of packages having a chip size exceeding 10 mm square.

Figure 27:
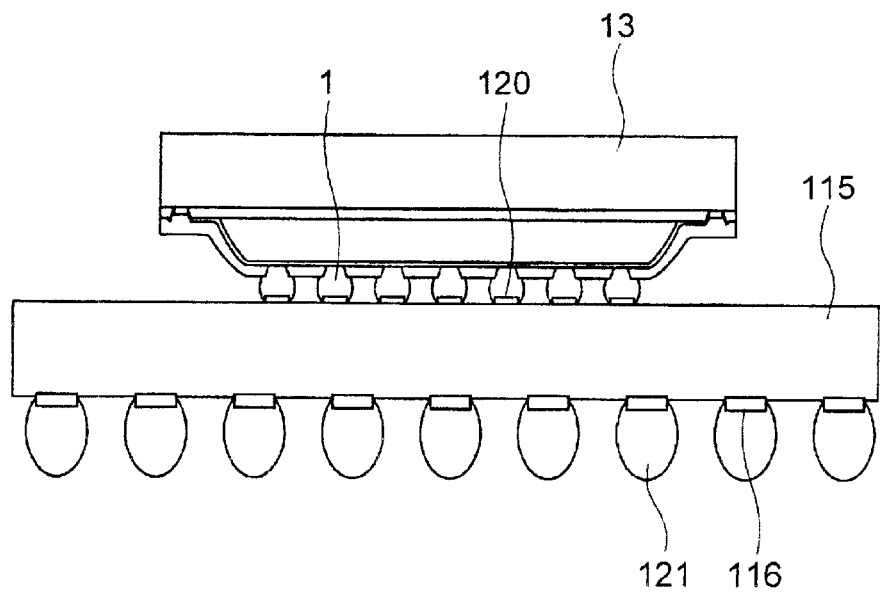
FIG. 27 is a sectional view illustrating another embodiment in which a semiconductor device of the present invention is mounted on a substrate.
Figure 28:
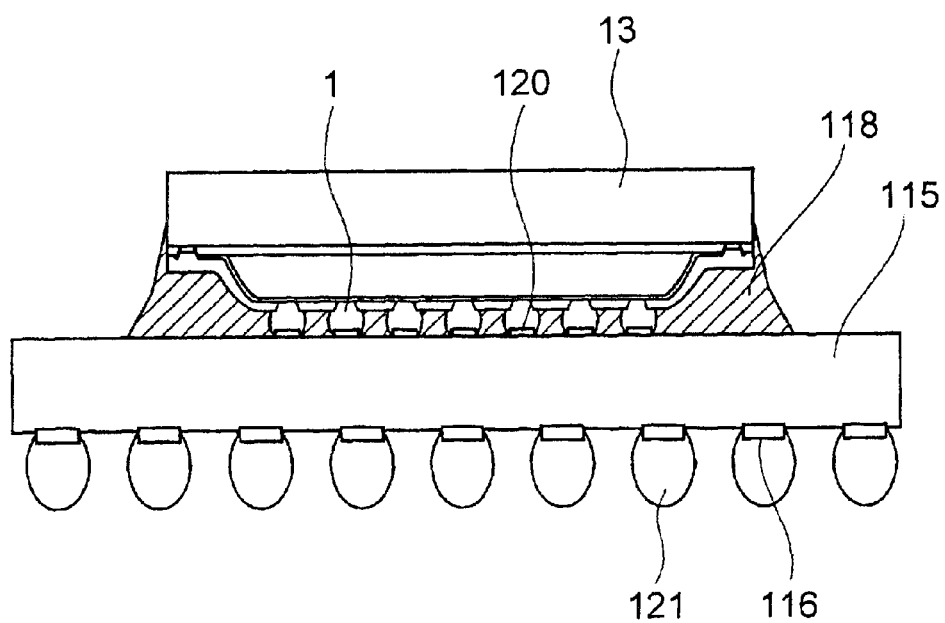
FIG. 28 is a sectional view illustrating yet another embodiment in which a semiconductor device of the present invention is mounted on a substrate.

Next, other embodiments of the semiconductor device 13 will be described below. FIG. 27 is a sectional outlined view illustrating a state that protrusive electrodes 1 of semiconductor device 13 are mounted on substrate 115 in order to alter the arrangement of the protrusive electrodes 1; and FIG. 28 is a sectional outlined view illustrating a state that the gap between substrate 115 and semiconductor device 13 mounted thereon are sealed with resin 118.

Protrusive electrodes 1 formed on semiconductor device 13 are mounted on the corresponding electrodes 120 on substrate 115 through intermediation of a solder paste or a flux, and the protrusive electrodes 1 are melted by means of a reflow furnace or the like to connect the substrate 115 to the semiconductor device 113. The substrate 115 mounting the semiconductor device 113 has, on the other side of the semiconductor-mounting side, electrodes 116 to be mounted on the substrate used in various electronic instruments and, according to need, protrusive electrodes 121.

When semiconductor device 13 is mounted on a substrate used in various electronic instruments, the protrusive electrodes provided on substrate 115 must be melted with heating. In order to further improve the results of reliability in such mounting processes and various tests, especially in the drop impact test, the gap between semiconductor device 13 and substrate 115 is reinforced with resin 118.

As the resin 118 filling the gap between semiconductor device 13 and substrate 115, conventional liquid resins used for sealing of semiconductors, such as liquid epoxy resin, phenolic resin, polyimide resin, silicone resin and the like, can be used. It is also possible to incorporate one or more kinds of particulate materials composed of an inorganic material such as silica, alumina, boron nitride and the like in order to control the coefficient of thermal expansion and elastic modulus of the sealing resin. It is also possible to incorporate a resin such as silicone resin or a thermoplastic resin, a coupler such as alkoxy-silane, titanate or the like, a colorant, a flame retardant for flame-retarding the resin composition, a curing accelerator for accelerating the curing reaction of flame-retarding assistant layer, etc. according to the need.

In this embodiment, it is possible to make a connection to various electronic instruments even when pitch of the protrusive electrode on the semiconductor device 113 is different from that of the electrodes on the substrate used in various electronic instruments, because the connection is made through intermediation of prescribed substrate 115.

This holds not only in a case of mounting on the substrate of semiconductor device 113 but also in a case of mounting on circuit substrates used in general electronic instruments.

The effect of the present invention consists in realizing a semiconductor device enabling a flip chip connection without use of underfill, which is prevented from the break of wiring layer and can be produced with a lessened number of defectives.

What is claimed is:

1. A semiconductor device comprising:
   a semiconductor element having a circuit surface on which a plurality of circuit electrodes are disposed, said circuit surface being coated with a protecting film,
   a stress relaxation layer which is formed on the protecting film of the circuit surface of said semiconductor element so as to expose the circuit electrodes, is made of a cured thermoplastic resin and has an inclination in the edge portion thereof, to form an inclined edge portion,
   a wiring layer comprised of a plurality of wirings, each of said wirings being connected to one of the circuit electrodes and disposed so as to make an electrical connection from said circuit electrode, via the edge portion of stress relaxation layer and to a desired site on the surface of the stress relaxation layer,
   a surface protecting film which covers a surface of the wiring layer so as to expose a prescribed portion on each of the plurality of wirings on the surface of the stress relaxation layer, and
   an external connection terminal formed by connecting a bump to said prescribed exposed portion of each of the plurality of wirings,
   wherein a protuberant portion is formed between the inclined edge portion and a flat portion of the stress relaxation layer and wherein a height of the protuberant portion is slightly higher than a height of the flat portion.

2. A semiconductor device according to claim 1, wherein a protuberant portion is formed in the surrounding part connected to the inclined edge portion of the stress relaxation layer, and a deflected portion is formed in the wiring existing on said protuberant portion.

3. A semiconductor device according to claim 1 or 2, wherein the melting temperature Tm of the thermoplastic resin in said stress relaxation layer is not lower than the maximum attainable temperature Tmax in the process of forming said wiring layer and surface protecting layer.

4. A semiconductor device according to claim 1 or 2, wherein a melting temperature Tm of the thermoplastic resin in the stress relaxation layer is not lower than 350° C.

5. A semiconductor device according to claim 1 or 2, wherein glass transition temperature Tg of the thermoplastic resin in said stress relaxation layer is in the range of from 150° C. to 400° C.

6. A semiconductor device according to claim 1 or 2, wherein a coefficient of thermal expansion of the thermoplastic resin in said stress relaxation layer is not greater than 200 ppm/° C.

7. A semiconductor device according to claim 1 or 2, wherein thickness of said stress relaxation layer is in the range of from about 35 µm to about 150 µm.

8. A semiconductor device according to claim 1 or 2, wherein the thermoplastic resin in said stress relaxation layer is at least one member selected from the group consisting of polyimide, polyamide, polyamide-imide, epoxy, phenolic and silicone.

9. A semiconductor device according to claim 1 or 2, wherein the protecting film formed on the semiconductor element is constituted of an inorganic film and an organic film locally formed on said inorganic film.

10. A semiconductor device according to claim 1 or 2, wherein the wirings are formed so that a width of the wiring in the edge portion of said stress relaxation layer is greater than the width of wiring in a flat portion of said stress relaxation layer, at least regarding signal wirings.

11. A semiconductor device according to claim 1 or 2, wherein said wiring layer is constituted of an electric power supply film layer contact-bonded to the surface of said stress relaxation layer and a plating film layer.

12. A semiconductor device according to claim 1, wherein said wirings are formed also on said protuberant portion.

13. A semiconductor device according to claim 1, wherein said wiring each have a deflected portion on said protuberant portion.

14. A semiconductor device according to claim 1, wherein said external connection terminal does not contain lead.

15. A semiconductor device according to claim 1, wherein said thermoplastic resin is prepared by coating a varnish on a first electrically insulating film and volatilizing a solvent in the varnish.

16. A semiconductor device according to claim 1, wherein in the inclined edge portion of said stress relaxation layer, a wiring shape is different between a signal line and a ground line or between a signal line and an electric source line among said wirings.

17. A semiconductor device comprising:
   a semiconductor element having a plurality of circuit electrodes disposed thereon and a circuit surface coated with a protecting film,
   a stress relaxation layer formed on the protecting film of the circuit surface of said semiconductor element so as to expose the circuit electrodes, which is made of a thermoplastic resin having a glass transition temperature Tg falling in the range of from 150° C. to 400° C. and has an inclination in an edge portion thereof,
   a wiring layer consisting of a plurality of wirings, each of said wirings being connected to one of the circuit electrodes and disposed so as to make an electrical connection from said circuit electrode, via the edge portion of stress relaxation layer and to a desired site on a surface of the stress relaxation layer,
   a surface protecting film which covers a surface of the wiring layer so as to expose a prescribed portion on each of the plurality of wirings on the surface of the stress relaxation layer, and
   an external connection terminal formed by connecting a bump to said prescribed exposed portion of each of the plurality of exposed wirings, wherein a protuberant portion is formed between the inclined edge portion and a flat portion of the stress relaxation layer and wherein a height of the protuberant portion is slightly higher than a height of the flat portion.

18. A semiconductor device according to claim 17, wherein a thickness of said stress relaxation layer is in the range of from about 35 μm to about 150 μm.

19. A mounted structure of semiconductor device constituted by mounting a semiconductor according to any one of claims 1 to 18 on a circuit substrate by connecting an external connection terminal of said semiconductor device to an electrode formed on said circuit substrate.

20. A semiconductor device comprising:
 a semiconductor element having an electrode on a surface thereof,
 a first electrically insulating film which covers an electrode-formed face of the semiconductor element and has an opening part at a position corresponding to said electrode, and
 a second electrically insulating layer formed on said first electrically insulating film,
 wherein said second electrically insulating layer relaxes a stress between said semiconductor device and a substrate on which said semiconductor device is to be mounted, and said second electrically insulating layer is comprised of a thermoplastic resin,
 wherein a protuberant portion is formed between an inclined portion and a flat portion of the second electrically insulating layer and wherein a height of the protuberant portion is slightly higher than a height of the flat portion.

21. A semiconductor device according to claim 20, wherein an opposite side to the portion connected to said electrode in said wiring has an external connection terminal to be electrically connected to the substrate on which said semiconductor device is to be mounted.

22. A semiconductor device according to claim 21, wherein said external connection terminal does not contain lead.

23. A semiconductor device according to claim 20, wherein a width of the wiring in an inclined portion of said second electrically insulating is wider than a width of the wiring in a flat portion of said second electrically insulating, regarding a width of the wiring of at least either and electric source or ground of said wirings.

24. A semiconductor device according to claim 20, wherein in an inclined portion of said second electrically insulating, the wiring shape is different between a signal line and a ground line or between a signal line and an electric source line.

* * * * *